(12) United States Patent
Yen et al.

(10) Patent No.: US 11,942,445 B2
(45) Date of Patent: Mar. 26, 2024

(54) SEMICONDUCTOR DEVICE WITH CONDUCTIVE PAD

(71) Applicant: Taiwan Semiconductor Manufacturing Company, Ltd., Hsinchu (TW)

(72) Inventors: Chen-En Yen, Changhua County (TW); Chin-Wei Kang, Tainan (TW); Kai-Jun Zhan, Taoyuan (TW); Wen-Hsiung Lu, Tainan (TW); Cheng-Jen Lin, Kaohsiung (TW); Ming-Da Cheng, Taoyuan (TW); Mirng-Ji Lii, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 271 days.

(21) Appl. No.: 17/409,138

(22) Filed: Aug. 23, 2021

(65) Prior Publication Data

US 2021/0384152 A1  Dec. 9, 2021

Related U.S. Application Data

(62) Division of application No. 16/868,909, filed on May 7, 2020, now Pat. No. 11,101,233.

(51) Int. Cl.
*H01L 23/00* (2006.01)

(52) U.S. Cl.
CPC .............. *H01L 24/11* (2013.01); *H01L 24/13* (2013.01); *H01L 24/81* (2013.01); *H01L 2224/1145* (2013.01); *H01L 2224/1147* (2013.01); *H01L 2224/13026* (2013.01); *H01L 2224/13111* (2013.01); *H01L 2224/13139* (2013.01); *H01L 2224/13144* (2013.01); *H01L 2224/13147* (2013.01); *H01L 2224/81801* (2013.01)

(58) Field of Classification Search
CPC ........... H01L 24/11; H01L 24/81; H01L 24/13
See application file for complete search history.

(56) References Cited

U.S. PATENT DOCUMENTS

| 4,620,215 A | * | 10/1986 | Lee ......................... H01L 24/29 257/E23.125 |
| 9,935,047 B2 | | 4/2018 | Lii et al. |
| 9,978,656 B2 | | 5/2018 | Lin et al. |
| 10,141,475 B1 | * | 11/2018 | Chen ....................... H01L 24/04 |

* cited by examiner

*Primary Examiner* — Dale E Page
*Assistant Examiner* — Wilner Jean Baptiste
(74) *Attorney, Agent, or Firm* — Birch, Stewart, Kolasch & Birch, LLP

(57) ABSTRACT

A semiconductor device is provided. The semiconductor device includes a substrate having a surface. The semiconductor device includes a conductive pad over a portion of the surface. The conductive pad has a curved top surface, and a width of the conductive pad increases toward the substrate. The semiconductor device includes a device over the conductive pad. The semiconductor device includes a solder layer between the device and the conductive pad. The solder layer covers the curved top surface of the conductive pad, and the conductive pad extends into the solder layer.

20 Claims, 39 Drawing Sheets

SEMICONDUCTOR DEVICE WITH CONDUCTIVE PAD

CROSS REFERENCE

This application is a Divisional of U.S. application Ser. No. 16/868,909, filed on May 7, 2020, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes. It is also a challenge to bond the semiconductor devices to other devices.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a top view of the substrate, the insulating layer, and the conductive wire of FIG. 1A, in accordance with some embodiments.

FIG. 1A-2 is a top view of the substrate, the insulating layer, and the conductive wire of FIG. 1A, in accordance with some embodiments.

FIG. 1B-1 is a top view of the semiconductor device of FIG. 1B, in accordance with some embodiments.

FIG. 1E-1 is a top view of the semiconductor device of FIG. 1E, in accordance with some embodiments.

FIG. 1E-2 is a top view of the semiconductor device of FIG. 1E, in accordance with some embodiments.

FIG. 1F-1 is a bottom view of a device of FIG. 1F, in accordance with some embodiments.

FIG. 1F-2 is a bottom view of a device of FIG. 1F, in accordance with some embodiments.

FIG. 1G-1 is a top view of the semiconductor device of FIG. 1G, in accordance with some embodiments.

FIG. 1G-2 is a top view of the semiconductor device of FIG. 1G, in accordance with some embodiments.

FIG. 2 is a cross-sectional view of a semiconductor device, in accordance with some embodiments.

DETAILED DESCRIPTION

Figure 1A:
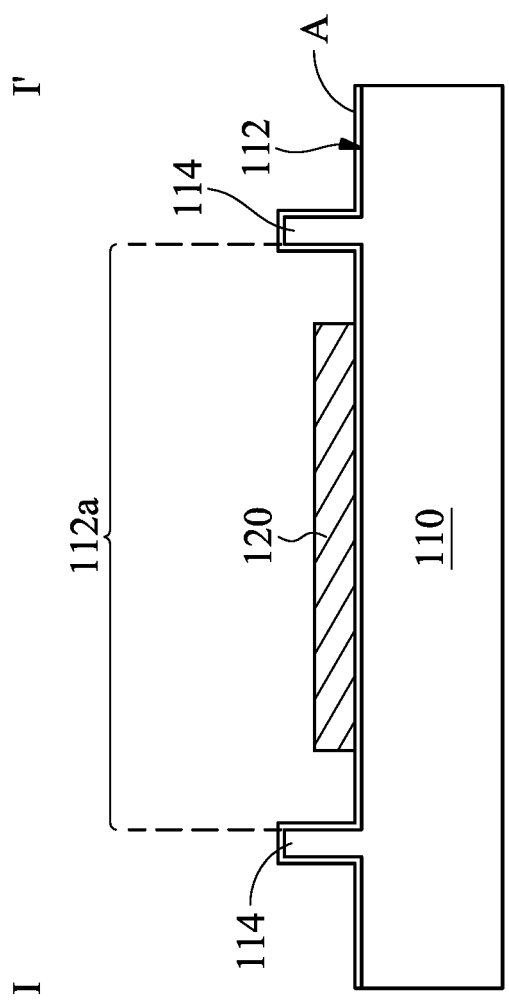
FIGS. 1A-1G are cross-sectional views of various stages of a process for forming a semiconductor device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figures 1, 1A:
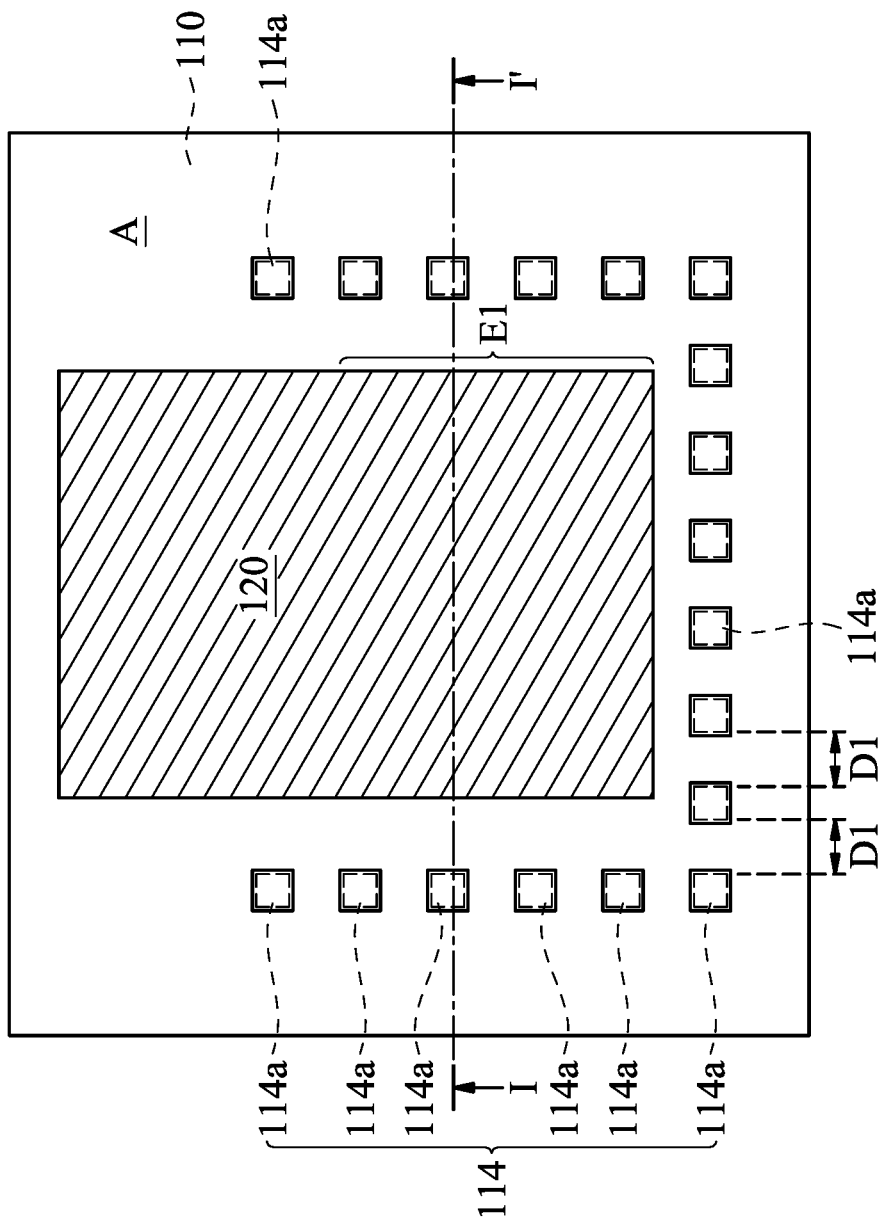

FIGS. 1A-1G are cross-sectional views of various stages of a process for forming a semiconductor device, in accordance with some embodiments. FIG. 1A-1 is a top view of the substrate, the insulating layer, and the conductive wire of FIG. 1A, in accordance with some embodiments. FIG. 1A is a cross-sectional view illustrating the semiconductor device along a sectional line I-I' in FIG. 1A-1, in accordance with some embodiments. As shown in FIGS. 1A and 1A-1, a substrate 110 is provided, in accordance with some embodiments.

The substrate 110 has a surface 112 and a protrusion portion 114, in accordance with some embodiments. The protrusion portion 114 protrudes from the surface 112, in accordance with some embodiments. The protrusion portion 114 is adjacent to a portion 112a of the surface 112, in accordance with some embodiments. The protrusion portion 114 surrounds the portion 112a of the surface 112, in accordance with some embodiments.

As shown in FIGS. 1A and 1A-1, the protrusion portion 114 includes pillar structures 114a spaced apart from each other, in accordance with some embodiments. The pillar structures 114a are spaced apart from each other by the same distance D1, in accordance with some embodiments.

The substrate 110 includes, for example, a semiconductor substrate. In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown). The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1A and 1A-1, an insulating layer A is formed over the substrate 110, in accordance with some embodiments. The insulating layer A is made of oxide (such as silicon oxide), fluorosilicate glass (FSG), a low-k dielectric material, polyimide, silicon nitride, un-doped silicate glass (USG), and/or another suitable insulating material, in accordance with some embodiments. The insulating layer A may be formed by an atomic layer deposition (ALD) process, a chemical vapor deposition (CVD) process, a physical vapor deposition (PVD) process, a thermal oxidation process, or another applicable process.

As shown in FIGS. 1A and 1A-1, a conductive wire 120 is formed over the insulating layer A (or the substrate 110), in accordance with some embodiments. The protrusion portion 114 surrounds an end portion E1 of the conductive wire 120, in accordance with some embodiments. The conductive wire 120 is made of a conductive material, such as metal (e.g., tungsten, copper, or aluminum) or an alloy thereof, in accordance with some embodiments. The conductive wire 120 is formed using an electroplating plating process and an etching process, in accordance with some embodiments.

Figures 1, 1A, 2:
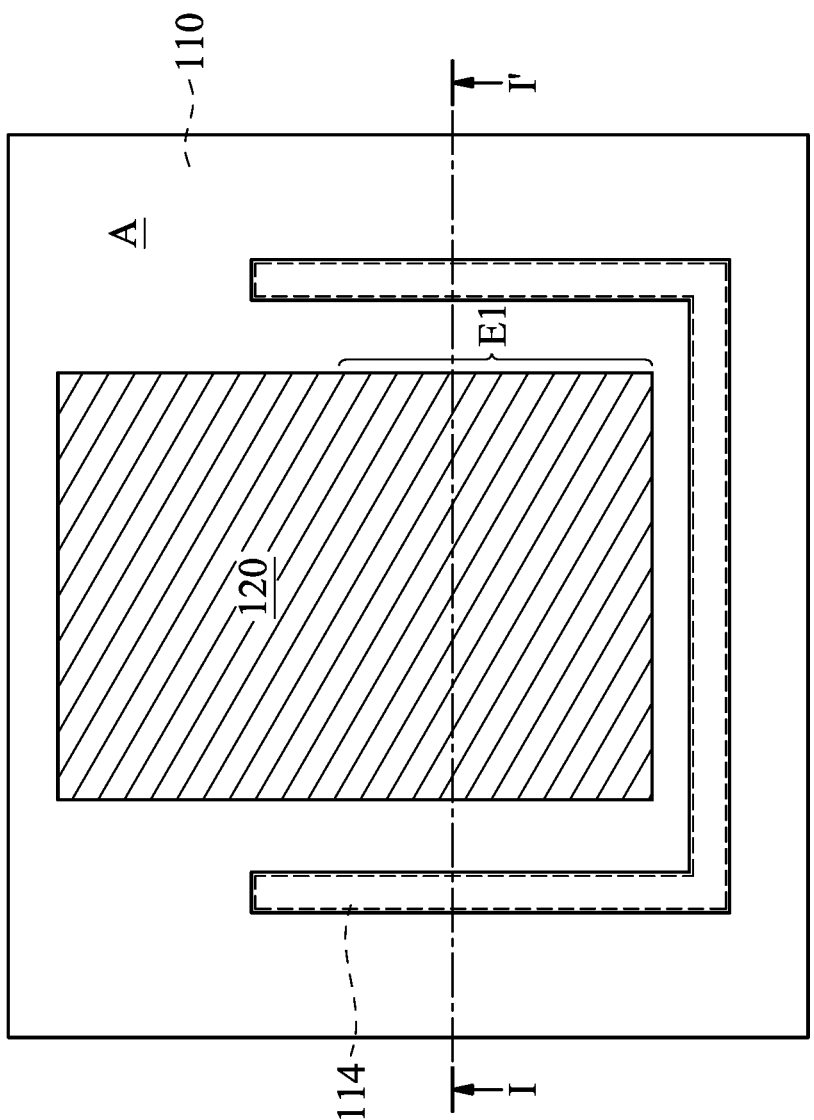

The protrusion portion 114 may have different variations, such as the protrusion portion 114 of FIG. 1A-2. FIG. 1A-2 is a top view of the substrate, the insulating layer, and the conductive wire of FIG. 1A, in accordance with some other embodiments. FIG. 1A is a cross-sectional view illustrating the semiconductor device along a sectional line I-I' in FIG. 1A-2, in accordance with some embodiments. As shown in FIGS. 1A and 1A-2, the protrusion portion 114 is a continuous strip structure, in accordance with some embodiments. The protrusion portion 114 continuously surrounds the end portion E1 of the conductive wire 120, in accordance with some embodiments.

Figure 1B:
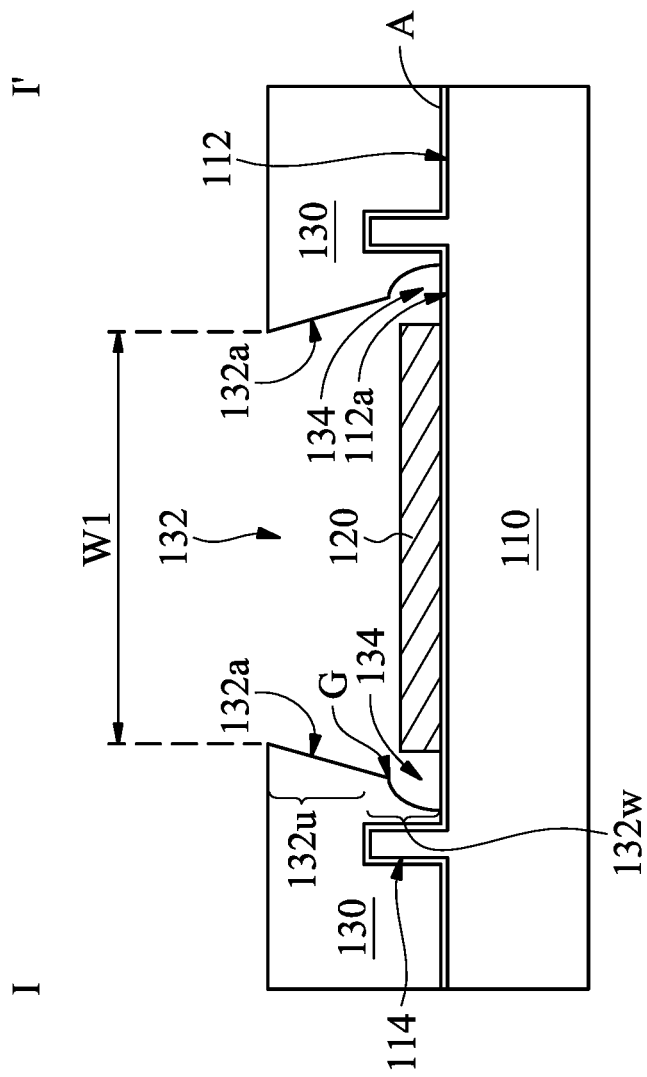
Figures 1, 1B:
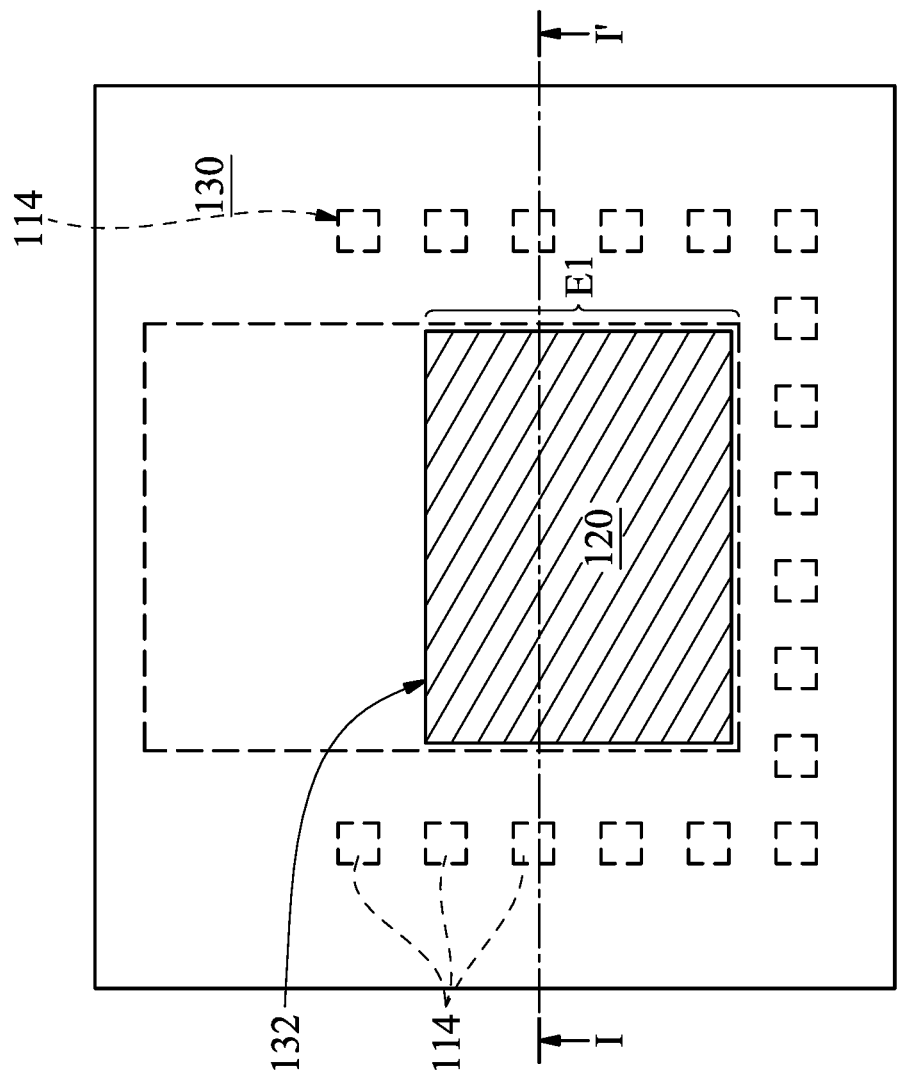

FIG. 1B-1 is a top view of the semiconductor device of FIG. 1B, in accordance with some embodiments. FIG. 1B is a cross-sectional view illustrating the semiconductor device along a sectional line I-I' in FIG. 1B-1, in accordance with some embodiments.

As shown in FIGS. 1B and 1B-1, a mask layer 130 is formed over the insulating layer A (or the surface 112 of the substrate 110) and a portion of the conductive wire 120, in accordance with some embodiments. The mask layer 130 covers the entire protrusion portion 114, in accordance with some embodiments. The mask layer 130 has an opening 132 over the portion 112a of the surface 112, in accordance with some embodiments.

The opening 132 exposes the end portion E1 of the conductive wire 120 and the insulating layer A over the portion 112a, in accordance with some embodiments. The opening 132 has an inner wall 132a, in accordance with some embodiments. In some embodiments, a width W1 of the opening 132 increases toward the substrate 110. The width W1 of the upper portion 132u of the opening 132 continuously increases toward the substrate 110, in accordance with some embodiments.

The mask layer 130 adjacent to the substrate 110 has a recess 134, in accordance with some embodiments. The recess 134 is recessed from the inner wall 132a of the opening 132, in accordance with some embodiments. The recess 134 continuously surrounds the end portion E1 of the conductive wire 120 exposed by the opening 132, in accordance with some embodiments.

The width W1 of the lower portion 132w of the opening 132 discontinuously increases toward the substrate 110, in accordance with some embodiments. The mask layer 130 has an edge portion G between the inner wall 132a of the opening 132 and the recess 134, in accordance with some embodiments. The edge portion G surrounds the portion of the conductive wire 120 exposed by the opening 132, in accordance with some embodiments.

The mask layer 130 is a photoresist layer, in accordance with some embodiments. The mask layer 130 is made of a negative photoresist material, in accordance with some embodiments. The negative photoresist material is capable of polymerizing and being rendered insoluble upon exposure to radiation, such as UV radiation.

The formation of the mask layer 130 includes forming a negative photoresist material layer over the insulating layer A; selectively exposing the negative photoresist material layer to radiation, causing polymerization to occur above those regions of the substrate 110 which are intended to be protected during a subsequent process; and removing the unexposed portions of the negative photoresist material layer by a solvent which has a minimal effect on the polymerized portion of the negative photoresist material layer.

Since the mask layer 130 is made of a negative photoresist material, which is capable of polymerizing and being rendered insoluble upon exposure to radiation, the mask layer 130 far away from the substrate 110 (i.e. the mask layer 130 close to the radiation) is wider than the mask layer 130 close to the substrate 110 (i.e. the mask layer 130 far away from the radiation) after performing a photolithography process.

In some embodiments, the negative photoresist material is added with additives to increase the light absorption coefficient of the upper portion of the mask layer 130. Therefore, the light absorption coefficient of the upper portion of the mask layer 130 is greater than the light absorption coefficient of the lower portion of the mask layer 130, in accordance with some embodiments. As a result, the additives help to form the recess 134, in accordance with some embodiments. The recess 134 may be formed using suitable additives added in the negative photoresist material, an exposure process with a suitable exposure energy, and a suitable development process.

Figure 1C:
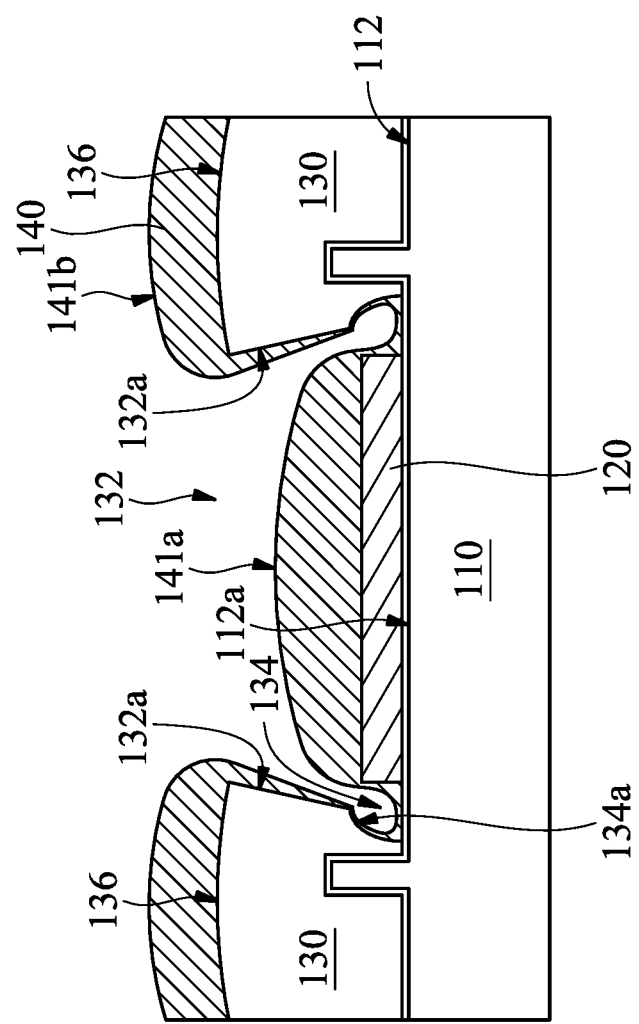

As shown in FIG. 1C, a conductive layer 140 is formed over the surface 112, the conductive wire 120, and the mask layer 130, in accordance with some embodiments. The conductive layer 140 covers a top surface 136 of the mask layer 130, the inner wall 132a of the opening 132, and the inner wall 134a of the recess 134, in accordance with some embodiments.

The conductive layer 140 is a single-layered structure, in accordance with some embodiments. In some other embodiments, the conductive layer 140 is a multi-layered structure. The conductive layer 140 is made of metal (e.g., gold, tin, copper, or silver) or alloys thereof, in accordance with some embodiments.

The conductive layer 140 is formed using a deposition process, such as an anisotropic deposition process, in accordance with some embodiments. The deposition rate of the conductive layer 140 over substantially vertical surfaces (e.g., the inner wall 132a of the opening 132) is less than the deposition rate of the conductive layer 140 over substantially horizontal surfaces (e.g., the top surfaces 122 and 136 of the conductive wire 120 and the mask layer 130), in accordance with some embodiments. Since the recess 134 is recessed from the inner wall 132a, the deposition rate of the conductive layer 140 in the recess 134 is less than the deposition rate of the conductive layer 140 over the inner wall 132a, in accordance with some embodiments.

The conductive layer 140 over the inner wall 134a of the recess 134 is thinner than the conductive layer 140 over the inner wall 132a of the opening 132, in accordance with some embodiments. The conductive layer 140 over the inner wall 132a is thinner than the conductive layer 140 over the conductive wire 120 (or the portion 112a of the surface 112), in accordance with some embodiments. The conductive layer 140 over the conductive wire 120 (or the portion 112a of the surface 112) is thinner than the conductive layer 140 over the top surface 136 of the mask layer 130, in accordance with some embodiments.

The deposition process includes a physical vapor deposition process, in accordance with some embodiments. Since the conductive layer 140 over the conductive wire 120 is formed using a physical vapor deposition process and is surrounded by the mask layer 130, the conductive layer 140 over the conductive wire 120 has a curved top surface 141a, in accordance with some embodiments.

Since the physical vapor deposition process generates heat in the mask layer 130, the mask layer 130 deforms and the top surface 136 of the mask layer 130 becomes a curved top surface, in accordance with some embodiments. The conductive layer 140 over the curved top surface 136 also has a curved top surface 141b, in accordance with some embodiments.

Figure 1D:
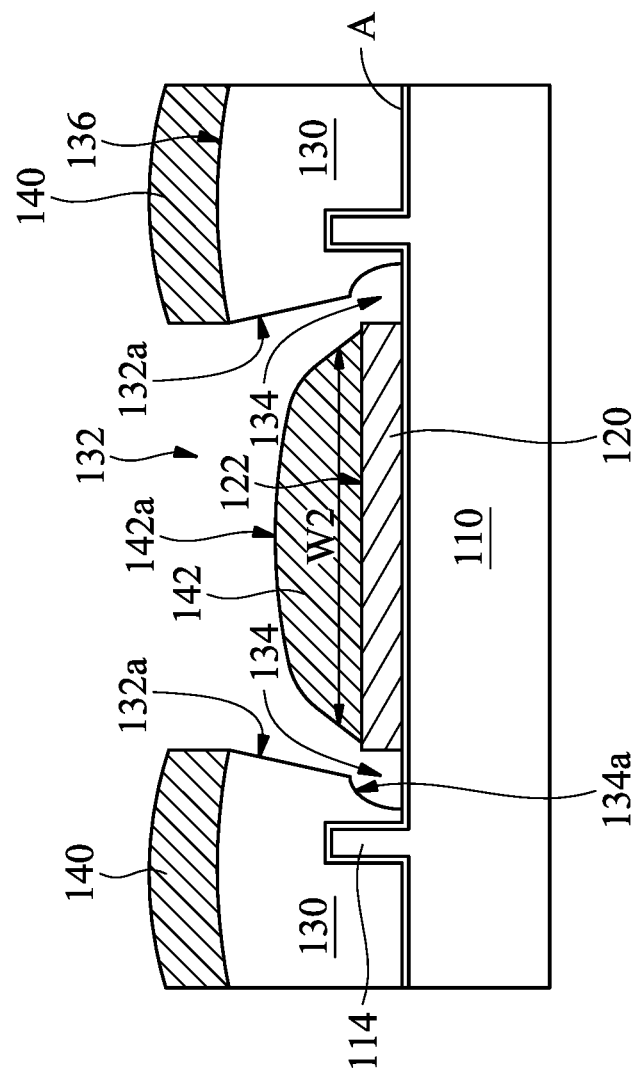

As shown in FIG. 1D, the conductive layer 140 over the inner wall 132a, the recess 134, and the insulating layer A is removed, in accordance with some embodiments. After the removal process, the conductive layer 140 remaining over the conductive wire 120 forms a conductive pad 142, in accordance with some embodiments.

The conductive pad 142 has a curved top surface 142a, in accordance with some embodiments. In some embodiments, a width W2 of the conductive pad 142 increases toward the substrate 110. The width W2 continuously increases toward the substrate 110, in accordance with some embodiments. The removal process includes an etching process, such as a wet etching process, in accordance with some embodiments.

Figure 1E:
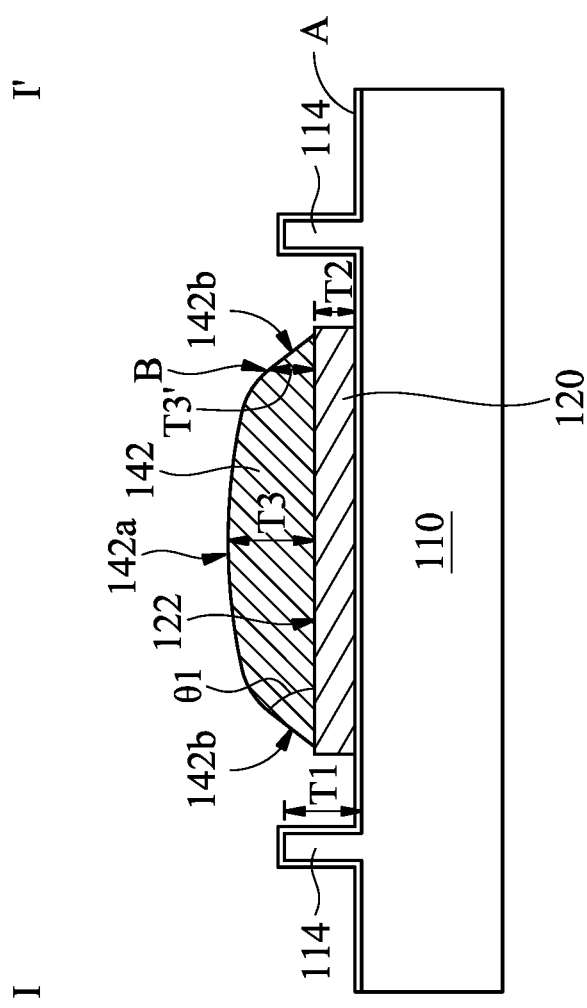
Figures 1, 1E:
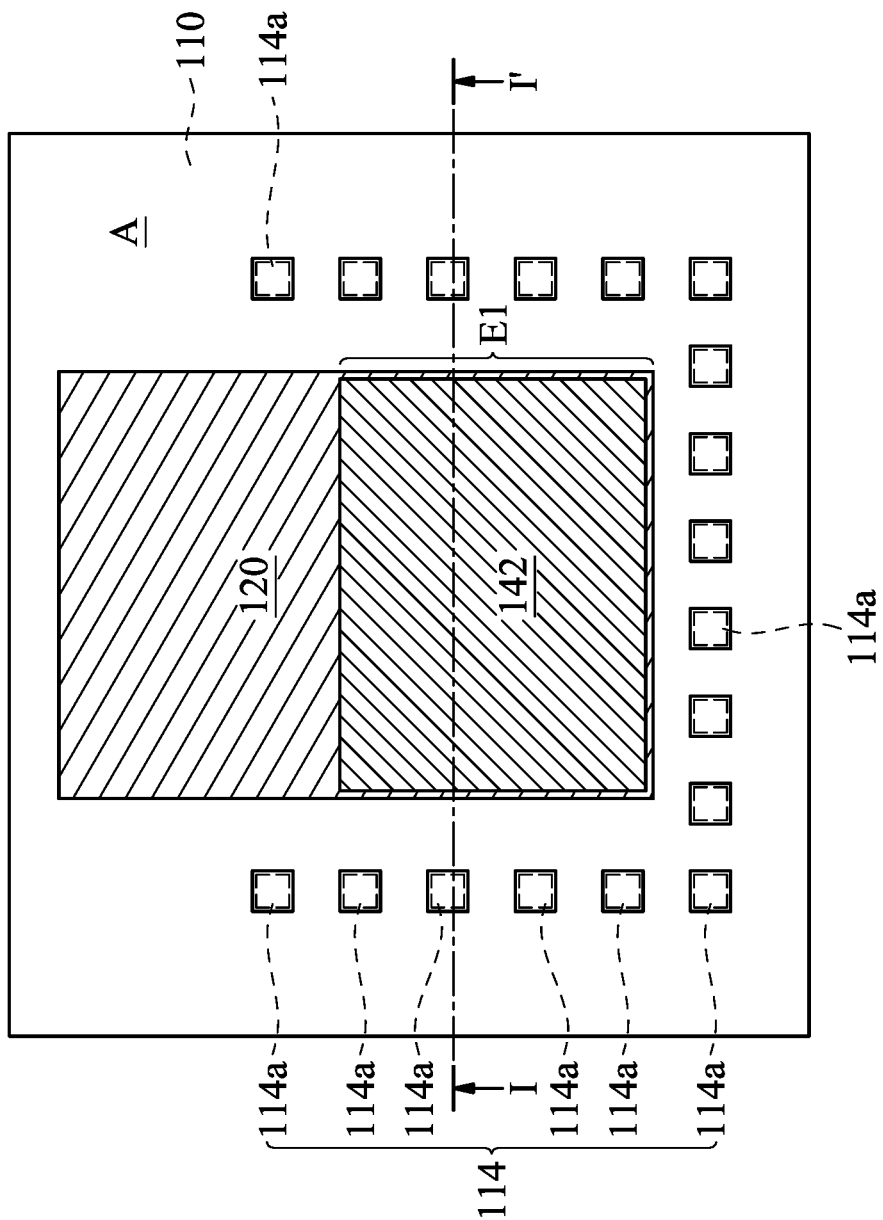
Figures 1, 1E, 2:
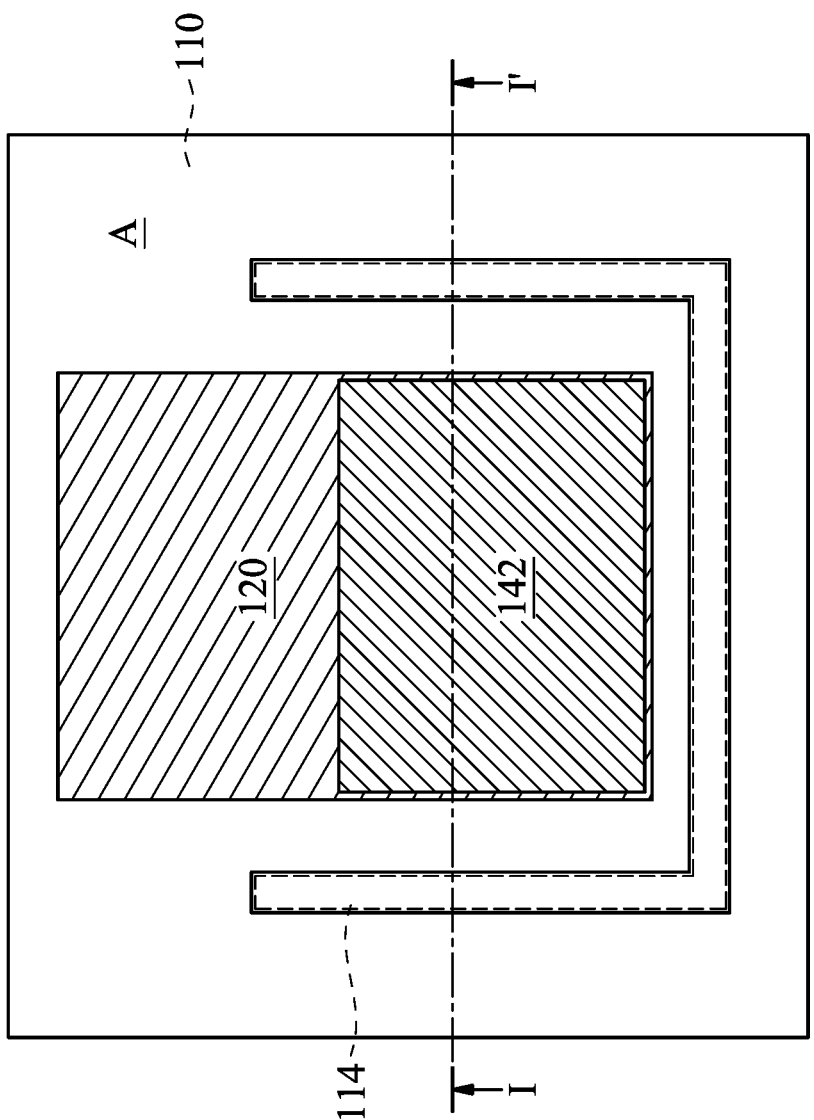

FIG. 1E-1 is a top view of the semiconductor device of FIG. 1E, in accordance with some embodiments. FIG. 1E is a cross-sectional view illustrating the semiconductor device along a sectional line I-I' in FIG. 1E-1, in accordance with some embodiments. As shown in FIGS. 1E and 1E-1, the mask layer 130 and the conductive layer 140 over the mask layer 130 are removed, in accordance with some embodiments. As shown in FIG. 1E-1, the pillar structures 114a surround the conductive pad 142, in accordance with some embodiments.

Since the conductive layer 140 over the inner wall 134a of the recess 134 is thinner than the conductive layer 140 over the inner wall 132a of the opening 132 (as shown in FIG. 1C), the conductive layer 140 over the inner wall 134a tends to be removed completely during the removal of the conductive layer 140 over the inner wall 132a (as shown in FIG. 1D), which helps to remove the mask layer 130 completely, in accordance with some embodiments. Therefore, the formation of the recess 134 improves the yield of the removal process of the mask layer 130, in accordance with some embodiments.

Since the conductive pad 142 is formed by a lift-off process (i.e., the steps of FIGS. 1B-1E), the formation of the conductive pad 142 is not affected by the protrusion portion 114 surrounding the conductive pad 142, in accordance with some embodiments. In contrast, if the conductive pad 142 is formed by an electroplating process, a seed layer for conducting electrical current during the electroplating process has poor step coverage uniformity over the protrusion portion 114, which results in high resistance of the seed layer and electroplating failure, in accordance with some embodiments.

Furthermore, if the formation of the conductive pad 142 includes: forming a stop layer over the substrate 110; depositing a conductive layer over the stop layer; performing a photolithography process and an etching process over the conductive layer; and etching the stop layer exposed by the remaining conductive layer, the etching process of the stop layer may damage the protrusion portion 114, in accordance with some embodiments.

As shown in FIG. 1E, the thickness T1 of the protrusion portion 114 is greater than the thickness T2 of the conductive wire 120, in accordance with some embodiments. The thickness T1 of the protrusion portion 114 is greater than the greatest thickness T3 of the conductive pad 142, in accordance with some embodiments. The greatest thickness T3 ranges from about 2500 nm to about 5500 nm, in accordance with some embodiments. The angle θ1 between a sidewall 142*b* of the conductive pad 142 and the top surface 122 of the conductive wire 120 ranges from about 45° to about 75°, in accordance with some embodiments.

The sidewall 142*b* is an inclined plane, in accordance with some embodiments. There is a boundary B between the sidewall 142*b* and the curved top surface 142*a*, in accordance with some embodiments. The conductive pad 142 under the boundary B has a thickness T3', in accordance with some embodiments. In some embodiments, a ratio of the thickness T3' to the greatest thickness T3 ranges from about 0.1 to about 0.7.

FIG. 1E-2 is a top view of the semiconductor device of FIG. 1E, in accordance with some other embodiments. FIG. 1E is a cross-sectional view illustrating the semiconductor device along a sectional line I-I' in FIG. 1E-2, in accordance with some embodiments. In some other embodiments, as shown in FIGS. 1E and 1E-2, the protrusion portion 114 continuously surrounds the conductive pad 142.

Figure 1F:
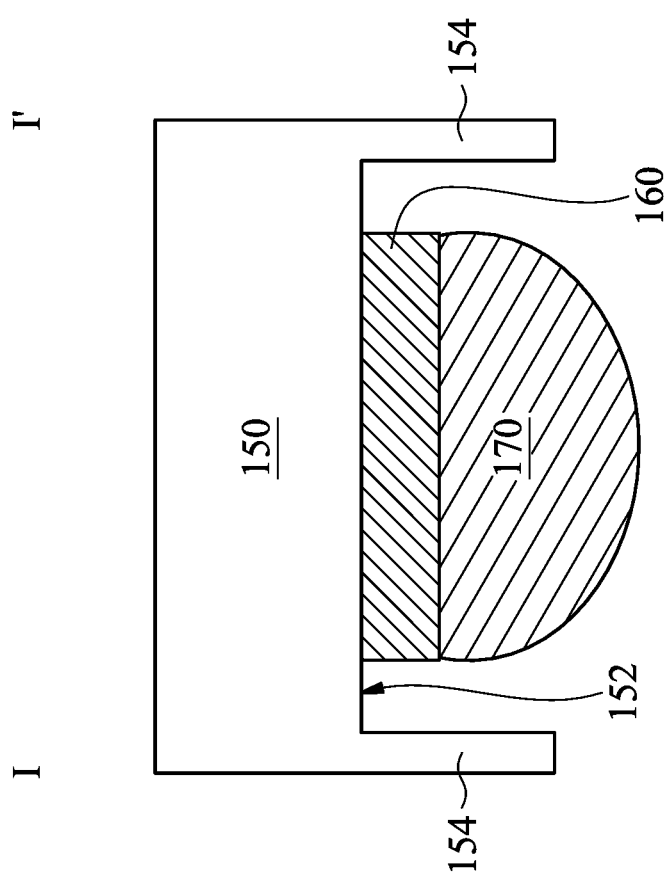
Figures 1, 1F:
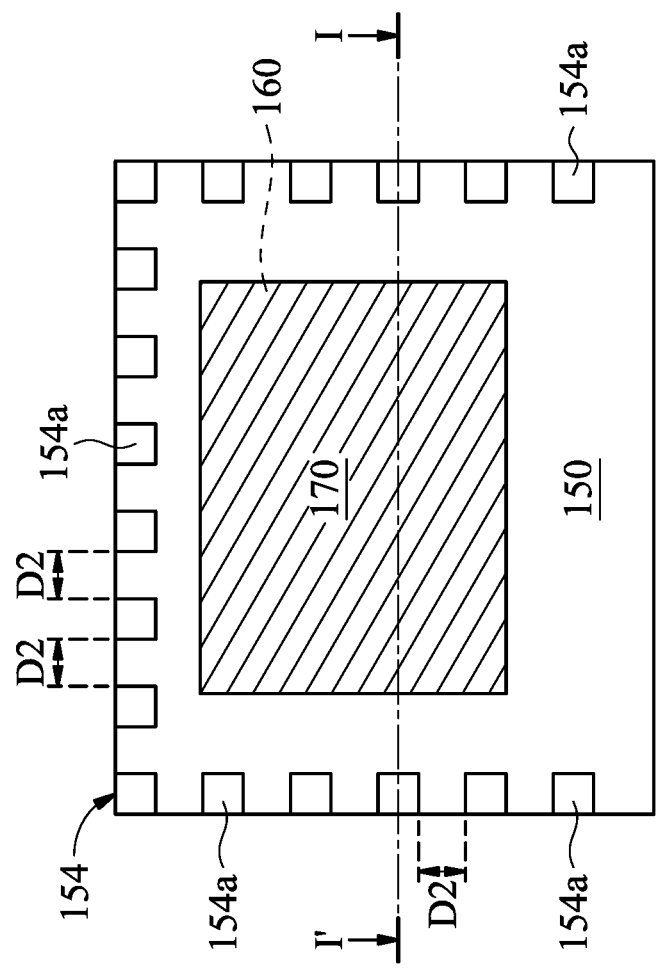
Figures 1, 1F, 2:
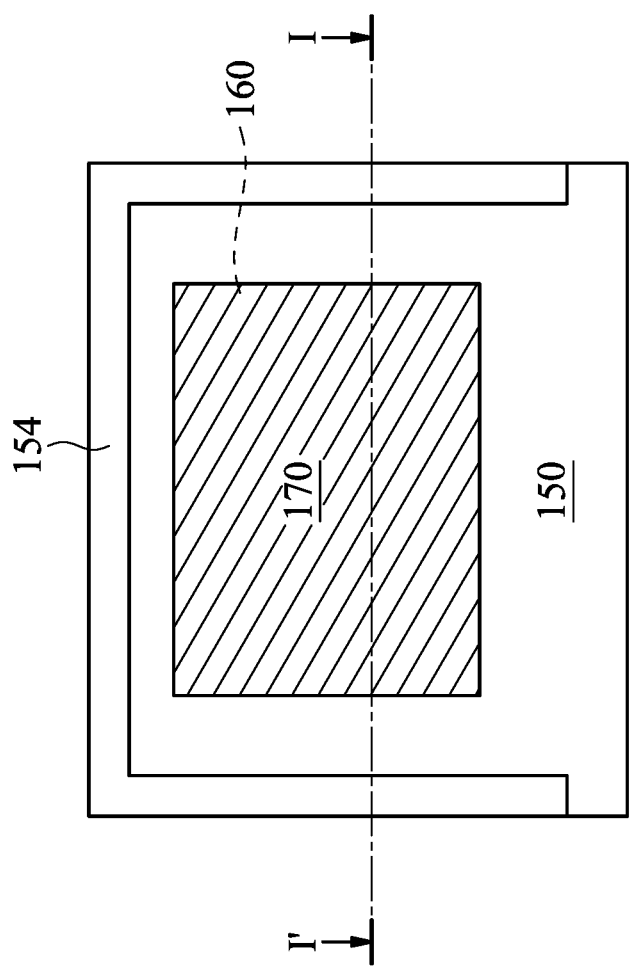

As shown in FIG. 1F, a device 150 is provided, in accordance with some embodiments. The device 150 includes a chip, a package, an active device, a passive device, a light emitting device, or another suitable device. The light emitting device includes laser diodes (not shown) for emitting laser beams, in accordance with some embodiments. The device 150 has a bottom surface 152 and a protrusion portion 154, in accordance with some embodiments. The protrusion portion 154 protrudes from the bottom surface 152, in accordance with some embodiments.

FIG. 1F-1 is a bottom view of the device 150 of FIG. 1F, in accordance with some embodiments. FIG. 1F is a cross-sectional view illustrating the device 150 along a sectional line I-I' in FIG. 1F-1, in accordance with some embodiments. As shown in FIGS. 1F and 1F-1, the protrusion portion 154 includes pillar structures 154*a*, in accordance with some embodiments.

The pillar structures 154*a* are spaced apart from each other, in accordance with some embodiments. The pillar structures 154*a* are spaced apart from each other by the same distance D2, in accordance with some embodiments. The distance D1 between the pillar structures 114*a* of FIG. 1A-1 is substantially equal to the distance D2, in accordance with some embodiments.

The term "substantially equal to" in the application means "within 10%", in accordance with some embodiments. For example, the term "substantially equal to" means the difference between the distances D1 and D2 is within 10% of the average of the distances D1 and D2, in accordance with some embodiments. The difference may be due to manufacturing processes.

As shown in FIG. 1F, a conductive pad 160 is formed over the bottom surface 152 of the device 150, in accordance with some embodiments. The conductive pad 160 is electrically connected to the laser diodes of the device 150, in accordance with some embodiments. The conductive pad 160 is made of a conductive material, such as metal (e.g., copper, aluminum, gold, or silver) or alloy thereof, in accordance with some embodiments.

As shown in FIGS. 1F and 1F-1, a solder layer 170 is formed over the conductive pad 160, in accordance with some embodiments. The conductive pad 160 is between the device 150 and the solder layer 170, in accordance with some embodiments. The solder layer 170 is made of a conductive material, such as an alloy material including tin, copper, silver, antimony, indium, zinc, and/or lead, in accordance with some embodiments. As shown in FIG. 1F-1, the protrusion portion 154 (or the pillar structures 154*a*) surrounds the conductive pad 160 and the solder layer 170, in accordance with some embodiments.

FIG. 1F-2 is a bottom view of the device 150 of FIG. 1F, in accordance with some other embodiments. FIG. 1F is a cross-sectional view illustrating the device 150 along a sectional line I-I' in FIG. 1F-2, in accordance with some embodiments. In some other embodiments, as shown in FIGS. 1F and 1F-2, the protrusion portion 154 is a continuous strip structure, in accordance with some embodiments. The protrusion portion 154 continuously surrounds the conductive pad 160 and the solder layer 170, in accordance with some embodiments.

Figure 1G:
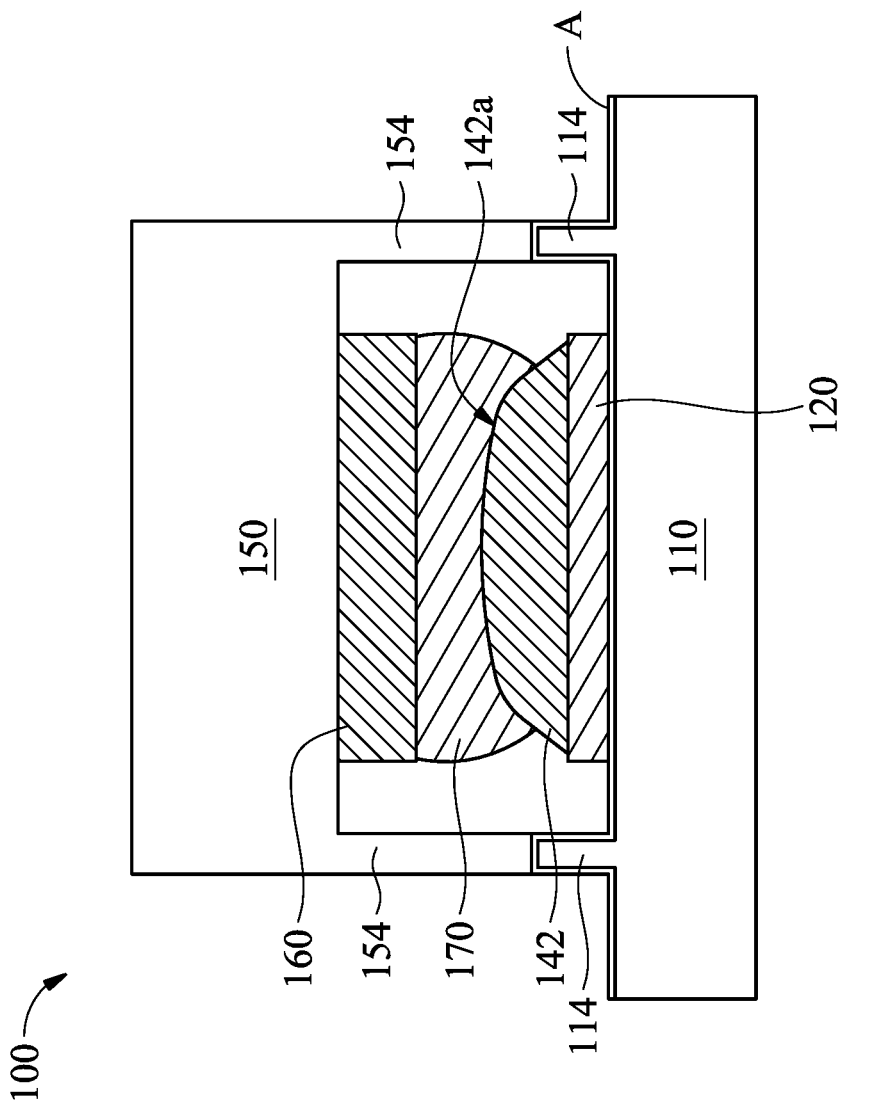
Figures 1, 1G:
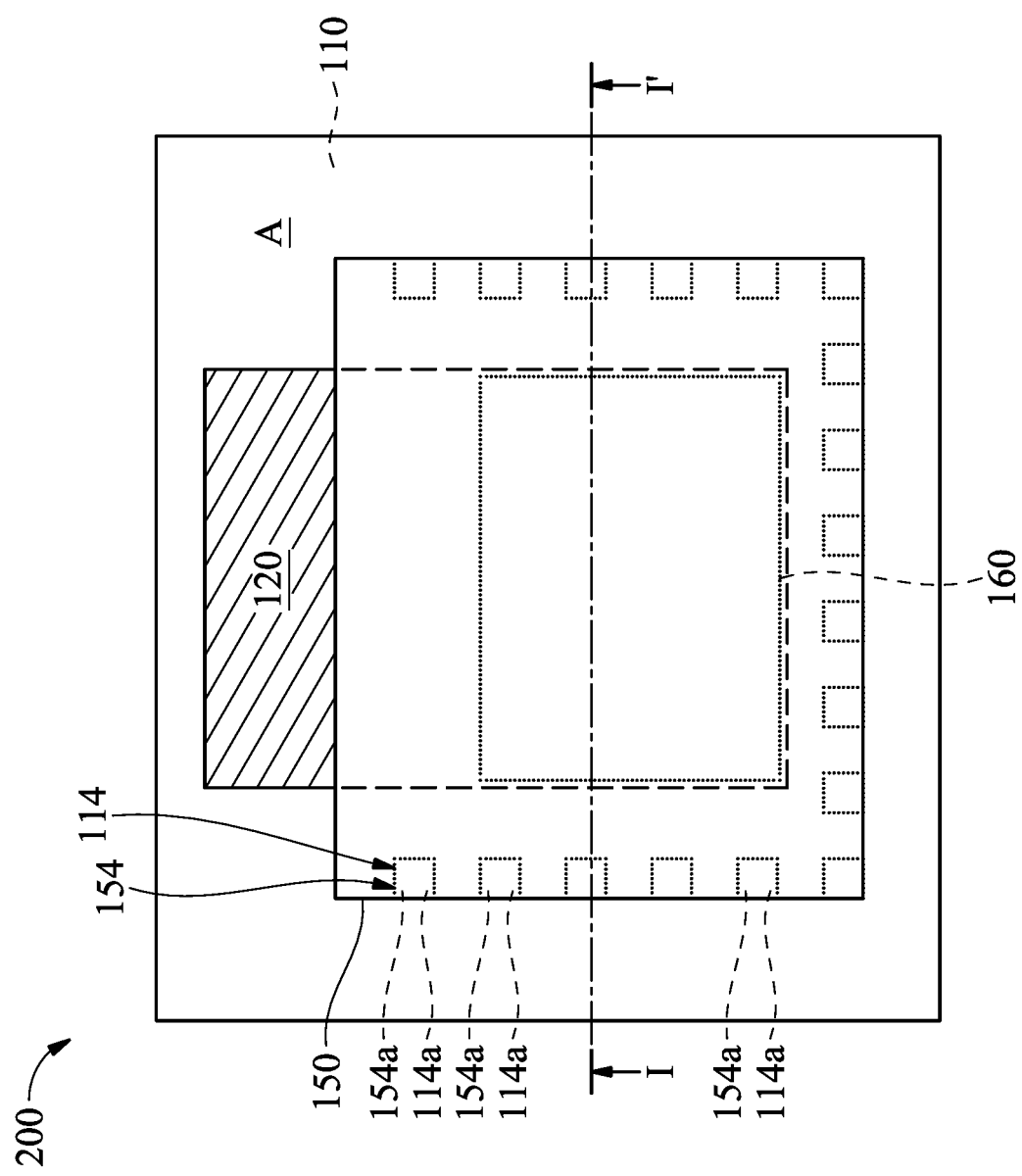
Figures 1, 1G, 2:
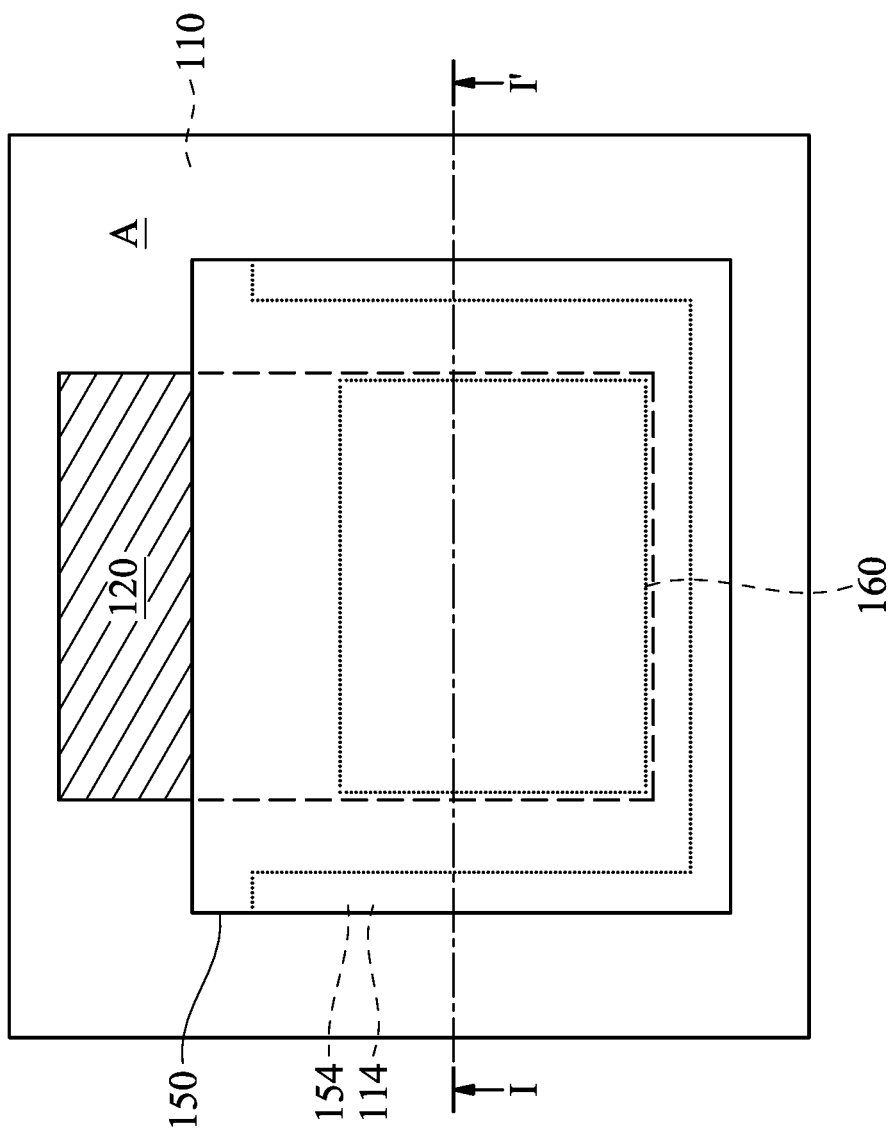
Figure 2:
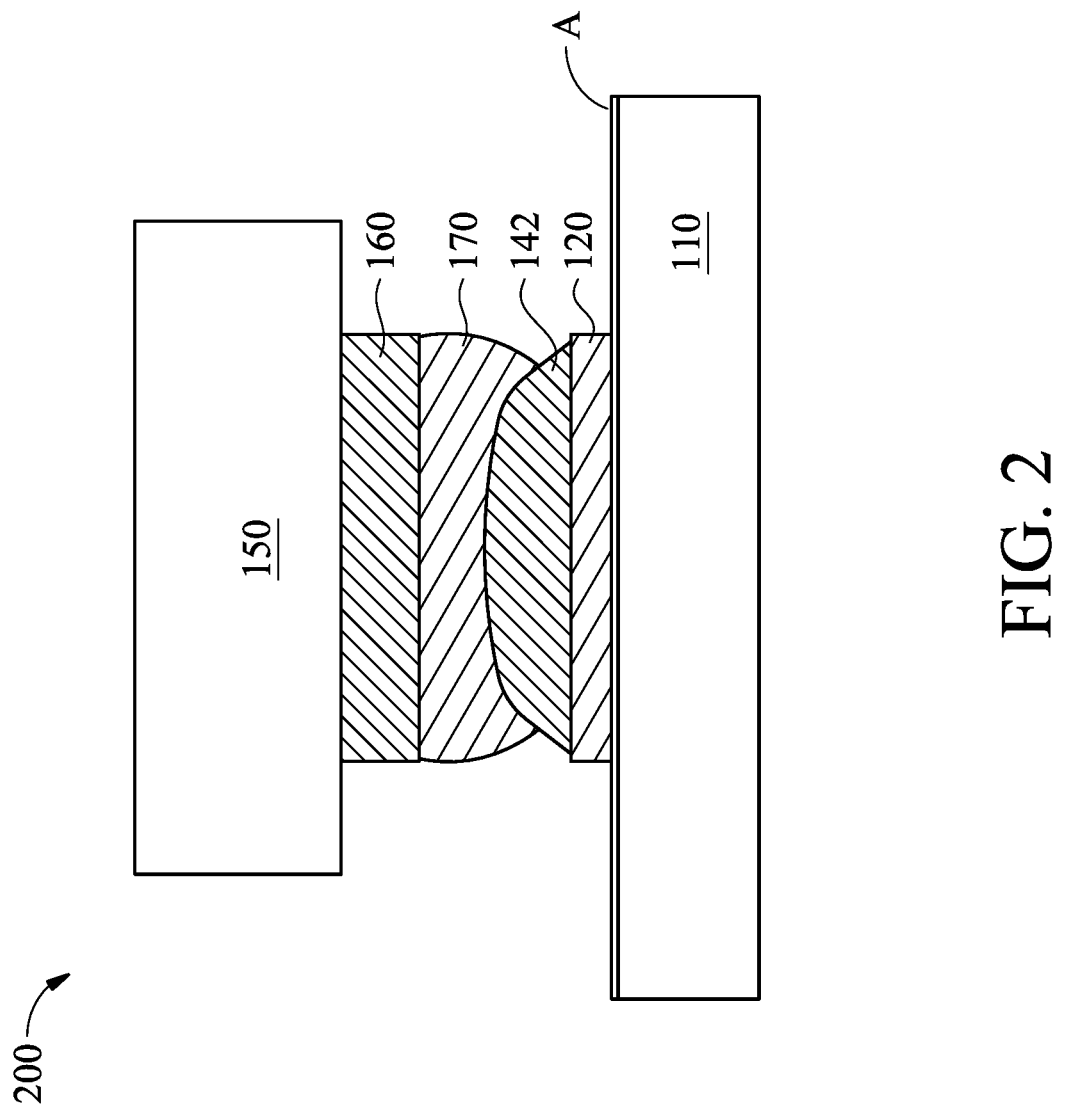

As shown in FIG. 1G, the device 150 is bonded to the conductive pad 142 through the conductive pad 160 and the solder layer 170, in accordance with some embodiments. In this step, a semiconductor device 100 is formed, in accordance with some embodiments. The protrusion portion 154 is bonded to the protrusion portion 114 (or the insulating layer A) during the bonding of the device 150 to the conductive pad 142, in accordance with some embodiments.

The protrusion portions 114 and 154 are configured to support the device 150 so as to maintain levelness of the device 150, which prevents the device 150 from being affected by the solder layer 170, in accordance with some embodiments. In some other embodiments, the insulating layer A is not formed over the protrusion portion 114, and the protrusion portion 154 is in direct contact with the protrusion portion 114.

The protrusion portion 154 is aligned with the protrusion portion 114, in accordance with some embodiments. If the protrusion portion 154 includes the pillar structures 154*a* (as shown in FIG. 1F-1), the protrusion portion 114 includes the pillar structures 114*a* (as shown in FIG. 1A-1), in accordance with some embodiments. If the protrusion portion 154 includes a continuous strip structure (as shown in FIG. 1F-2), the protrusion portion 114 includes a continuous strip structure (as shown in FIG. 1A-2), in accordance with some embodiments.

The protrusion portion 154 surrounds the conductive pad 142, in accordance with some embodiments. The solder layer 170 covers the curved top surface 142a, in accordance with some embodiments. The conductive pad 142 partially extends into the solder layer 170, in accordance with some embodiments. In some embodiments, an upper portion of the conductive pad 142 is embedded in the solder layer 170, in accordance with some embodiments. Therefore, the bondability between the conductive pad 142 and the solder layer 170 is improved, in accordance with some embodiments.

As shown in FIG. 1G-1, the protrusion portions 114 and 154 have the same shape, in accordance with some embodiments. As shown in FIG. 1G-1, the protrusion portion 154 includes the pillar structures 154a, and the protrusion portion 114 includes the pillar structures 114a, in accordance with some embodiments. The pillar structures 154a are respectively aligned with the corresponding pillar structures 114a thereunder, in accordance with some embodiments.

As shown in FIG. 1G-1, the pillar structure 154a and the corresponding pillar structure 114a thereunder have the same shape, such as a rectangular shape, a round shape, an oval shape, a triangle shape, or another polygonal shape, in accordance with some embodiments.

FIG. 1G-2 is a top view of the semiconductor device of FIG. 1G, in accordance with some other embodiments. FIG. 1G is a cross-sectional view illustrating the semiconductor device along a sectional line I-I' in FIG. 1G-2, in accordance with some embodiments. In some other embodiments, as shown in FIGS. 1G and 1G-2, the protrusion portion 154 includes a continuous strip structure, and the protrusion portion 114 includes a continuous strip structure.

The continuous strip structure of the protrusion portion 154 is aligned with the continuous strip structure of the protrusion portion 114, in accordance with some embodiments. As shown in FIG. 1G-2, the continuous strip structure of the protrusion portion 154 and the continuous strip structure of the protrusion portion 114 have the same shape, such as an U-shape, in accordance with some embodiments.

FIG. 2 is a cross-sectional view of a semiconductor device 200, in accordance with some embodiments. As shown in FIG. 2, the semiconductor device 200 is similar to the semiconductor device 100 of FIG. 1G, except that the semiconductor device 200 does not have the protrusion portions 114 and 154 of the semiconductor device 100, in accordance with some embodiments. The forming process of the semiconductor device 200 is similar to or the same as that of the semiconductor device 100, in accordance with some embodiments.

Figure 3A:
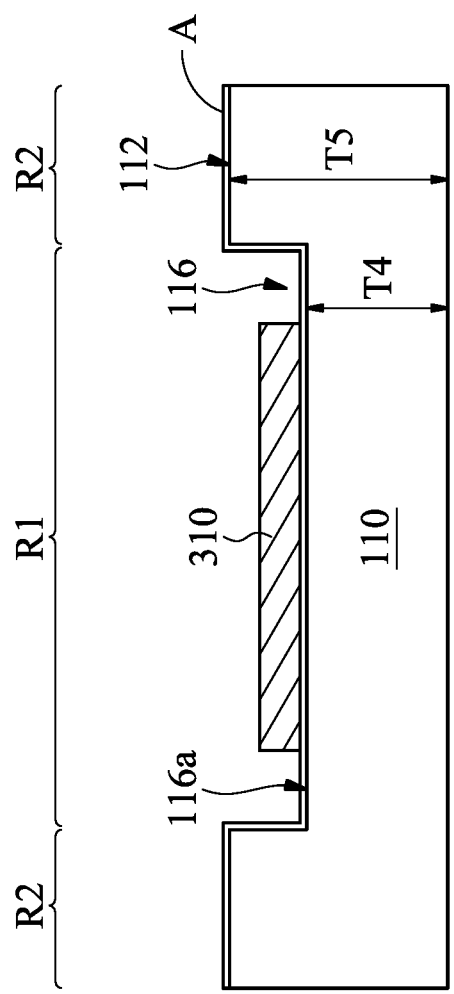
FIGS. 3A-3F are cross-sectional views of various stages of a process for forming a semiconductor device, in accordance with some embodiments.

FIGS. 3A-3F are cross-sectional views of various stages of a process for forming a semiconductor device, in accordance with some embodiments. As shown in FIG. 3A, a substrate 110 is provided, in accordance with some embodiments. The substrate 110 has regions R1 and R2, in accordance with some embodiments.

In some embodiments, a thickness T4 of the substrate 110 in the region R1 is different from a thickness T5 of the substrate 110 in the region R2, in accordance with some embodiments. The thickness T4 is less than the thickness T5, in accordance with some embodiments.

The substrate 110 has a surface 112, in accordance with some embodiments. The surface 112 has a recess 116, in accordance with some embodiments. The recess 116 is in the region R1, in accordance with some embodiments. As shown in FIG. 3A, an insulating layer A is formed over the surface 112 and in the recess 116, in accordance with some embodiments.

As shown in FIG. 3A, a conductive structure 310 is formed over the insulating layer A over a bottom surface 116a of the recess 116, in accordance with some embodiments. The conductive structure 310 includes a conductive wire, which is similar to or the same as the conductive wire 120 of FIG. 1G, or another suitable conductive structure.

The conductive structure 310 is made of a conductive material, such as metal (e.g., tungsten, copper, or aluminum) or an alloy thereof, in accordance with some embodiments. The conductive structure 310 is formed using an electroplating plating process and an etching process, in accordance with some embodiments.

Figure 3B:
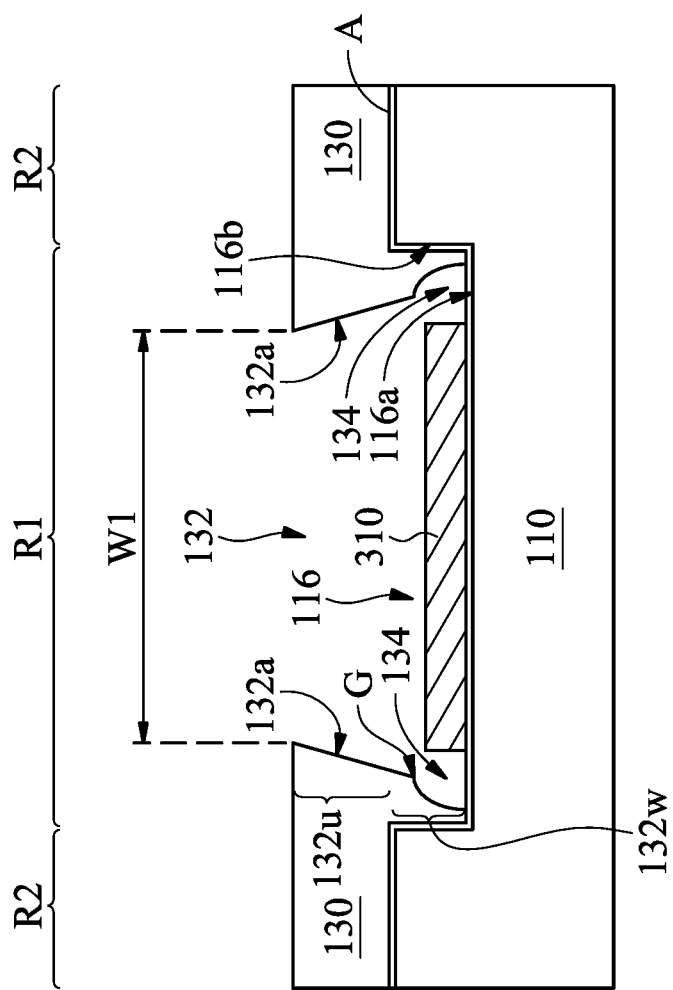

As shown in FIG. 3B, a mask layer 130 is formed over the insulating layer A, in accordance with some embodiments. The mask layer 130 has an opening 132, in accordance with some embodiments. The opening 132 is over the conductive structure 310, in accordance with some embodiments. The mask layer 130 covers inner walls 116b of the recess 116, in accordance with some embodiments.

The inner walls 116b are also referred to as a boundary between the regions R1 and R2, in accordance with some embodiments. The mask layer 130 extends across the boundary between the regions R1 and R2, in accordance with some embodiments.

In some embodiments, a width W1 of the opening 132 increases toward the substrate 110. The width W1 of the upper portion 132u of the opening 132 continuously increases toward the substrate 110, in accordance with some embodiments.

The mask layer 130 covering the inner walls 116b has a recess 134, in accordance with some embodiments. The recess 134 is recessed from an inner wall 132a of the opening 132, in accordance with some embodiments. The recess 134 is in the recess 116, in accordance with some embodiments. The recess 134 is close to the bottom surface 116a of the recess 116, in accordance with some embodiments.

The width W1 of the lower portion 132w of the opening 132 discontinuously increases toward the substrate 110, in accordance with some embodiments. The mask layer 130 has an edge portion G between the inner wall 132a of the opening 132 and the recess 134, in accordance with some embodiments. The edge portion G surrounds the conductive structure 310 exposed by the opening 132, in accordance with some embodiments.

Figure 3C:
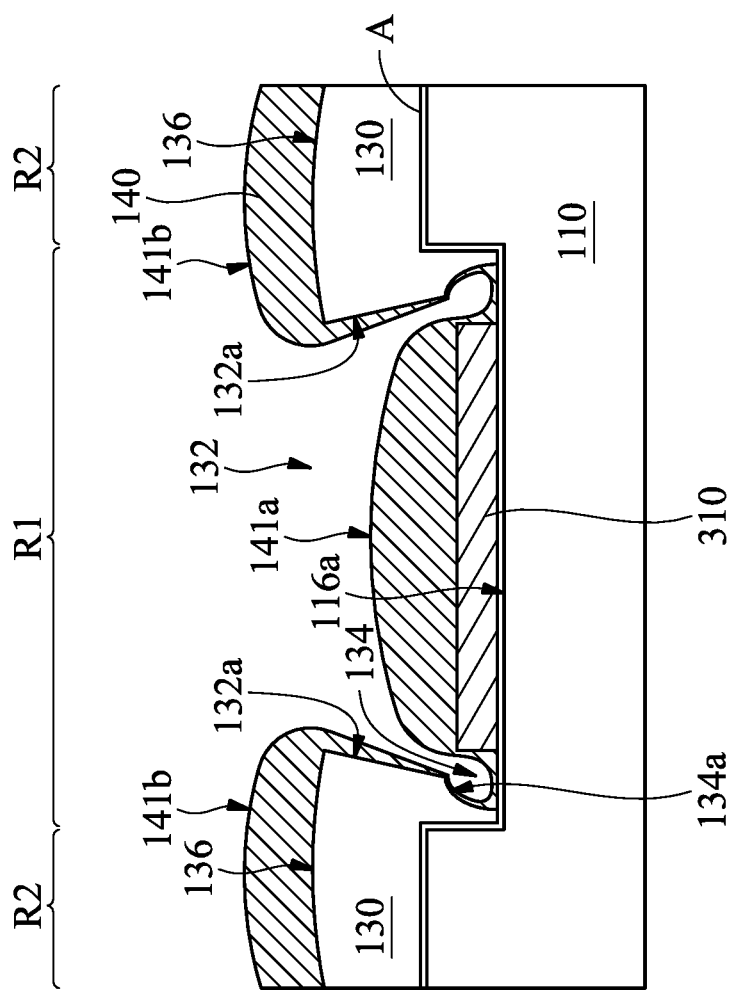

As shown in FIG. 3C, a conductive layer 140 is deposited over the conductive structure 310, the bottom surface 116a, and the mask layer 130, in accordance with some embodiments. The conductive layer 140 covers a top surface 136 of the mask layer 130, the inner wall 132a of the opening 132, and the inner wall 134a of the recess 134, in accordance with some embodiments.

The conductive layer 140 over the inner wall 134a is thinner than the conductive layer 140 over the inner wall 132a of the opening 132, in accordance with some embodiments. The conductive layer 140 over the inner wall 132a is thinner than the conductive layer 140 over the conductive structure 310, in accordance with some embodiments. The conductive layer 140 over the conductive structure 310 is thinner than the conductive layer 140 over the top surface 136 of the mask layer 130, in accordance with some embodiments.

The deposition process of the conductive layer 140 includes a physical vapor deposition process, in accordance with some embodiments. Since the conductive layer 140 over the conductive structure 310 is formed using a physical vapor deposition process and is surrounded by the mask layer 130, the conductive layer 140 over the conductive structure 310 has a curved top surface 141a, in accordance with some embodiments.

Since the physical vapor deposition process generates heat in the mask layer 130, the mask layer 130 deforms and the top surface 136 of the mask layer 130 becomes a curved top surface, in accordance with some embodiments. The conductive layer 140 over the curved top surface 136 also has a curved top surface 141b, in accordance with some embodiments.

Figure 3D:
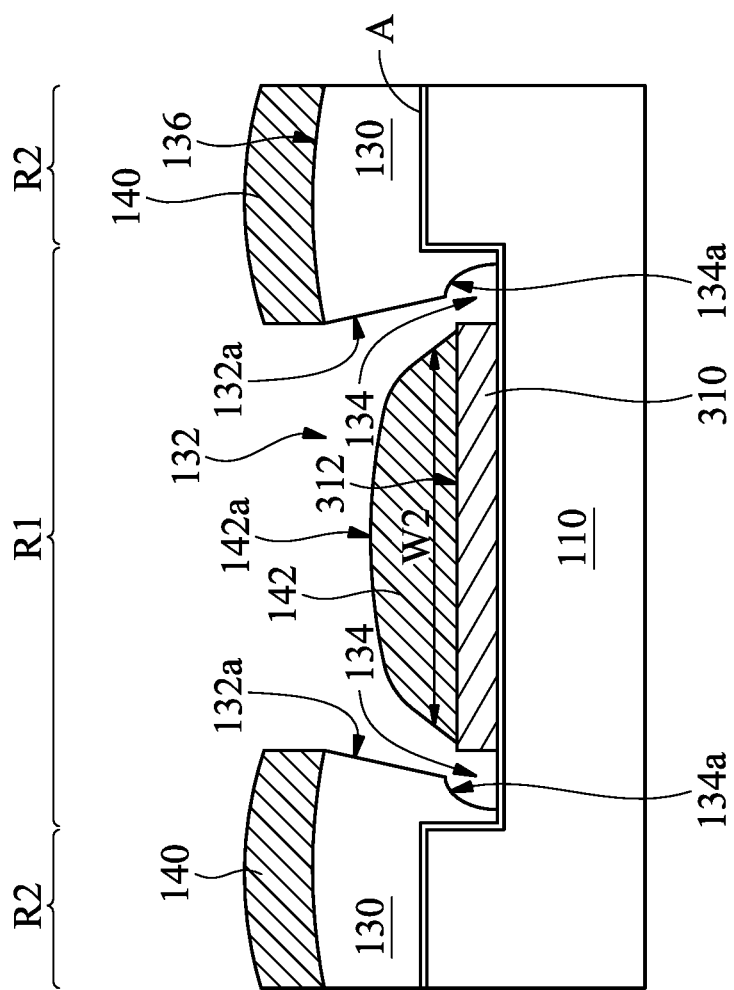

As shown in FIG. 3D, the conductive layer 140 over the inner wall 132a, the recess 134, and the insulating layer A is removed, in accordance with some embodiments. After the removal process, the conductive layer 140 remaining over the conductive structure 310 forms a conductive pad 142, in accordance with some embodiments.

The conductive pad 142 has a curved top surface 142a, in accordance with some embodiments. In some embodiments, a width W2 of the conductive pad 142 increases toward the substrate 110. The width W2 continuously increases toward the substrate 110, in accordance with some embodiments. The removal process includes an etching process, such as a wet etching process, in accordance with some embodiments.

Figure 3E:
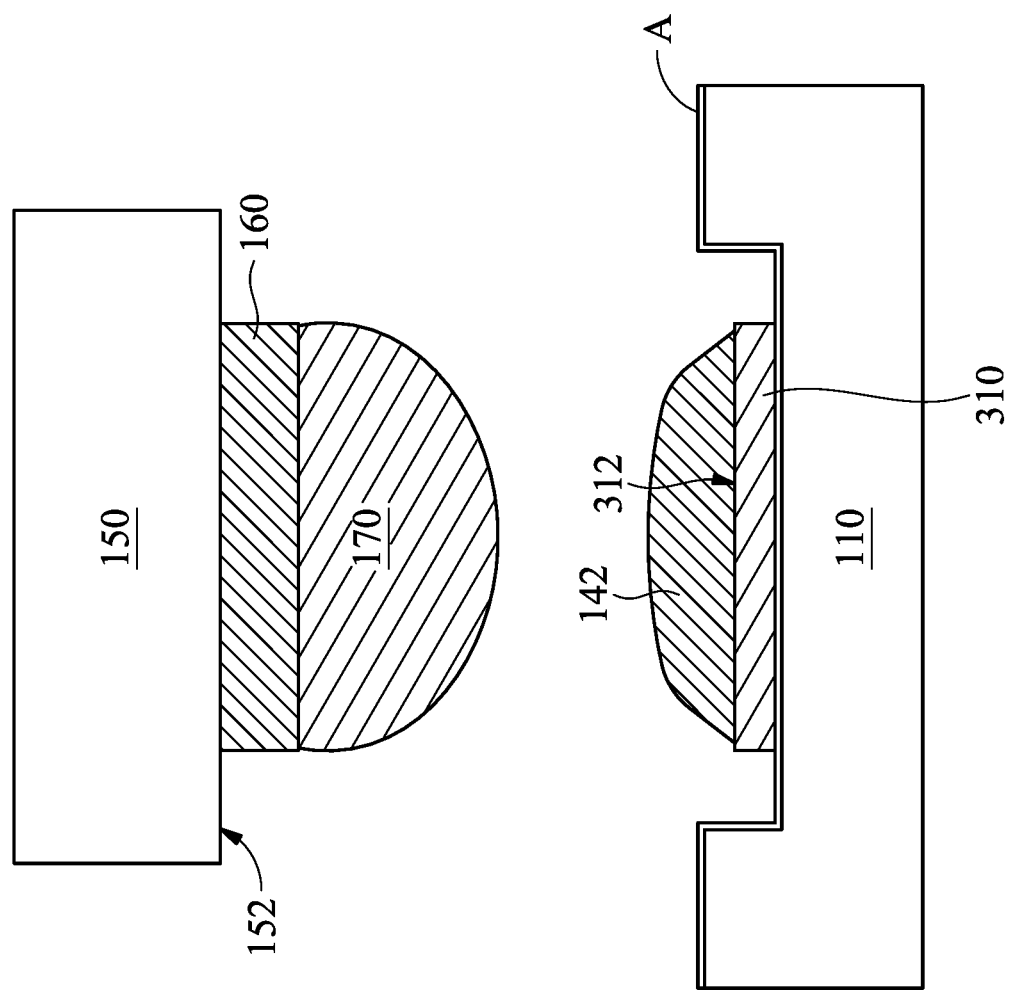

As shown in FIG. 3E, a device 150 is provided, in accordance with some embodiments. The device 150 includes a chip, a package, an active device, a passive device, a light emitting device, or another suitable device. The light emitting device includes laser diodes (not shown) for emitting laser beams, in accordance with some embodiments. The device 150 has a bottom surface 152, in accordance with some embodiments.

As shown in FIG. 3E, a conductive pad 160 is formed over the bottom surface 152 of the device 150, in accordance with some embodiments. The conductive pad 160 is electrically connected to the device 150, in accordance with some embodiments. As shown in FIG. 3E, a solder layer 170 is formed over the conductive pad 160, in accordance with some embodiments. The conductive pad 160 is between the device 150 and the solder layer 170, in accordance with some embodiments.

Figure 3F:
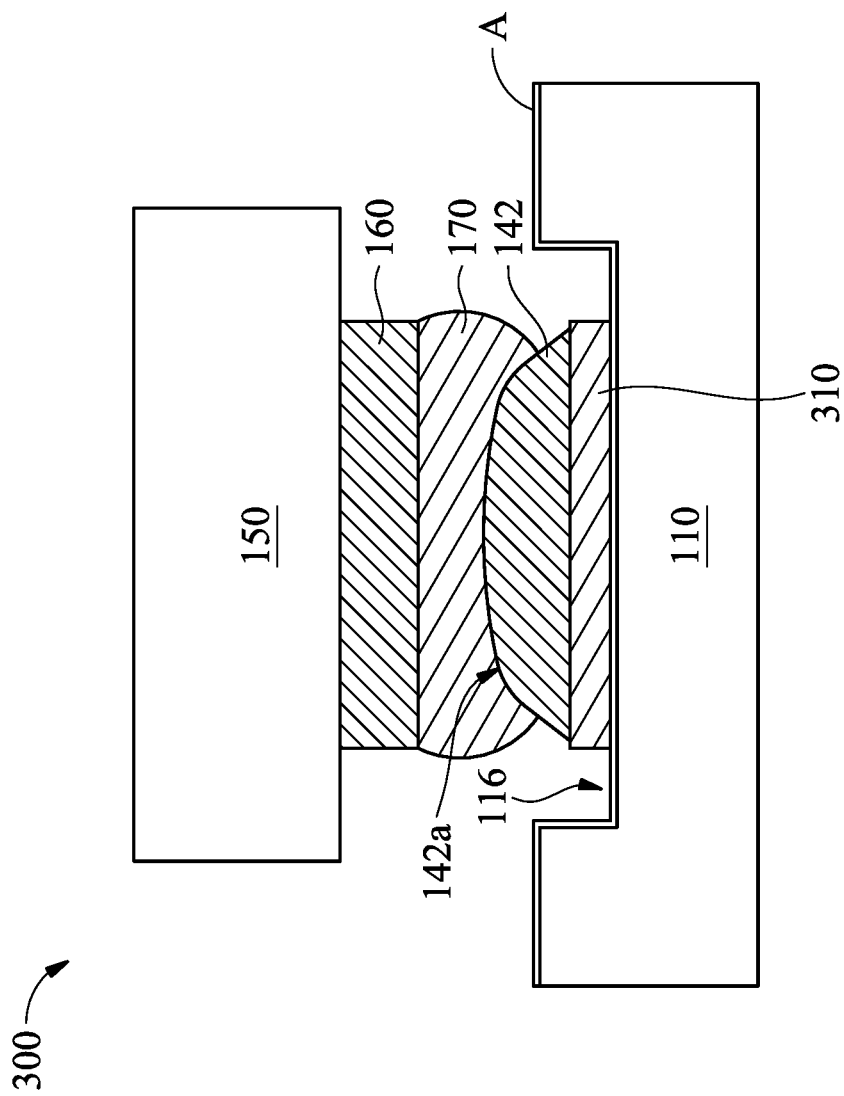

As shown in FIG. 3F, the device 150 is bonded to the conductive pad 142 through the conductive pad 160 and the solder layer 170, in accordance with some embodiments. The conductive pad 142 partially extends into the solder layer 170, in accordance with some embodiments. The solder layer 170 is partially in the recess 116, in accordance with some embodiments. In this step, a semiconductor device 300 is formed, in accordance with some embodiments.

Figure 4A:
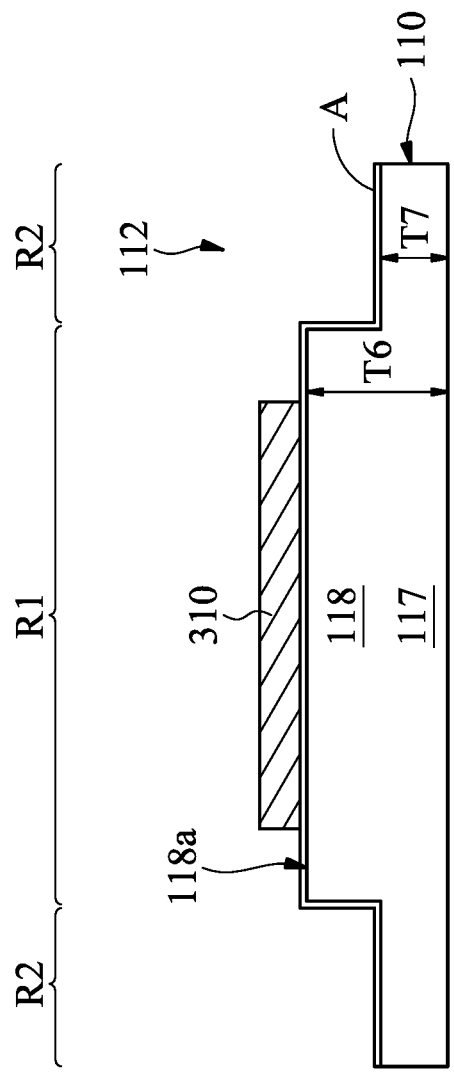
FIGS. 4A-4F are cross-sectional views of various stages of a process for forming a semiconductor device, in accordance with some embodiments.

FIGS. 4A-4F are cross-sectional views of various stages of a process for forming a semiconductor device, in accordance with some embodiments. As shown in FIG. 4A, a substrate 110 is provided, in accordance with some embodiments. The substrate 110 has regions R1 and R2, in accordance with some embodiments.

In some embodiments, a thickness T6 of the substrate 110 in the region R1 is different from a thickness T7 of the substrate 110 in the region R2, in accordance with some embodiments. The thickness T6 is greater than the thickness T7, in accordance with some embodiments.

The substrate 110 has a base 117 and a pedestal 118, in accordance with some embodiments. The pedestal 118 is over the base 117, in accordance with some embodiments. The base 117 is wider than the pedestal 118, in accordance with some embodiments. The base 117 is in the regions R1 and R2, in accordance with some embodiments. The pedestal 118 is in the region R1, in accordance with some embodiments.

As shown in FIG. 4A, an insulating layer A is formed over the substrate 110, in accordance with some embodiments. As shown in FIG. 4A, a conductive structure 310 is formed over the insulating layer A over a top surface 118a of the pedestal 118, in accordance with some embodiments. The conductive structure 310 includes a conductive wire, which is similar to or the same as the conductive wire 120 of FIG. 1G, or another suitable conductive structure.

Figure 4B:
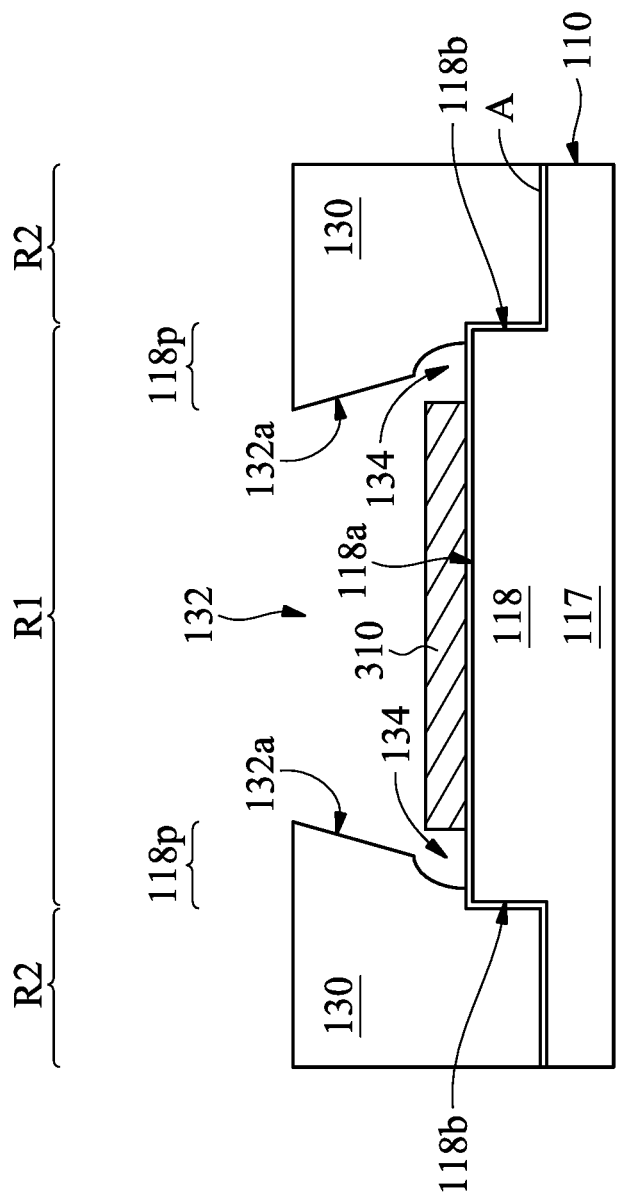

As shown in FIG. 4B, a mask layer 130 is formed over the base 117 and the pedestal 118, in accordance with some embodiments. The mask layer 130 has an opening 132, in accordance with some embodiments. The opening 132 is over the top surface 118a of the pedestal 118, in accordance with some embodiments. The mask layer 130 covers a peripheral portion 118p of the top surface 118a of the pedestal 118, in accordance with some embodiments.

The mask layer 130 over the pedestal 118 is thinner than the mask layer 130 over the base 117, in accordance with some embodiments. The mask layer 130 covers a sidewall 118b of the pedestal 118, in accordance with some embodiments. The sidewall 118b is also referred to as a boundary between the regions R1 and R2, in accordance with some embodiments.

Figure 4C:
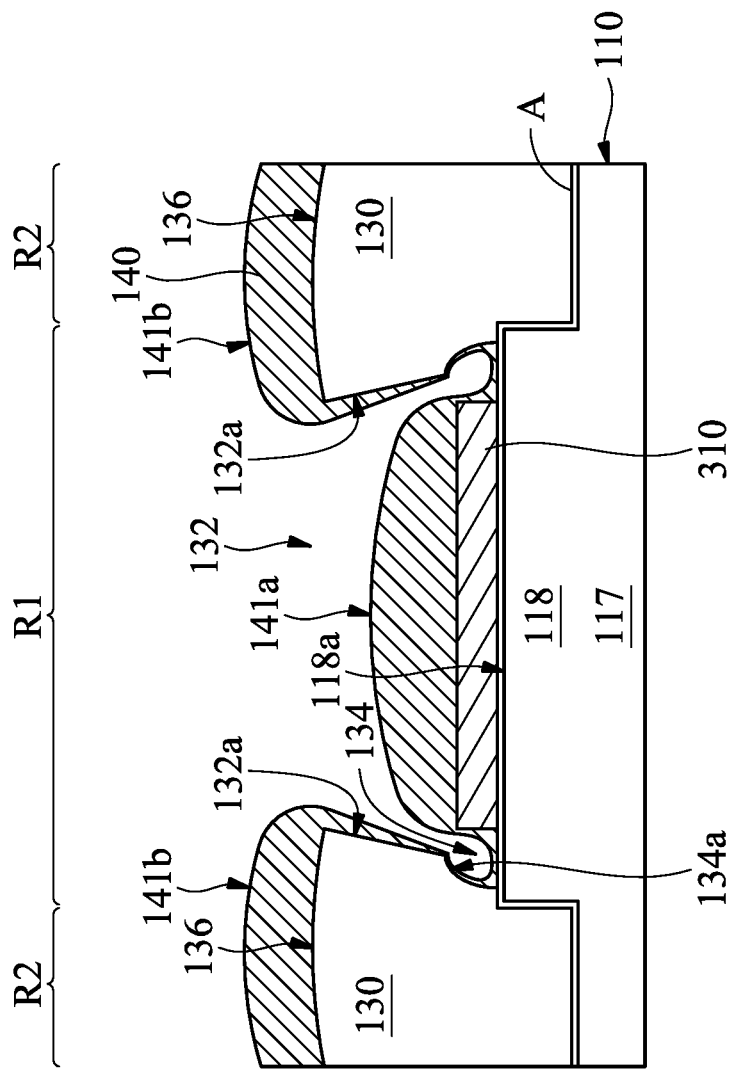

As shown in FIG. 4C, a conductive layer 140 is deposited over the conductive structure 310, the top surface 118a, and the mask layer 130, in accordance with some embodiments. The conductive layer 140 covers a top surface 136 of the mask layer 130, the inner wall 132a of the opening 132, and the inner wall 134a of the recess 134, in accordance with some embodiments.

The conductive layer 140 over the inner wall 134a is thinner than the conductive layer 140 over the inner wall 132a of the opening 132, in accordance with some embodiments. The conductive layer 140 over the inner wall 132a is thinner than the conductive layer 140 over the conductive structure 310, in accordance with some embodiments. The conductive layer 140 over the conductive structure 310 is thinner than the conductive layer 140 over the top surface 136 of the mask layer 130, in accordance with some embodiments.

The deposition process of the conductive layer 140 includes a physical vapor deposition process, in accordance with some embodiments. Since the conductive layer 140 over the conductive structure 310 is formed using a physical vapor deposition process and is surrounded by the mask layer 130, the conductive layer 140 over the conductive structure 310 has a curved top surface 141a, in accordance with some embodiments.

Since the physical vapor deposition process generates heat in the mask layer 130, the mask layer 130 deforms and the top surface 136 of the mask layer 130 becomes a curved top surface, in accordance with some embodiments. The conductive layer 140 over the curved top surface 136 also has a curved top surface 141b, in accordance with some embodiments.

Figure 4D:
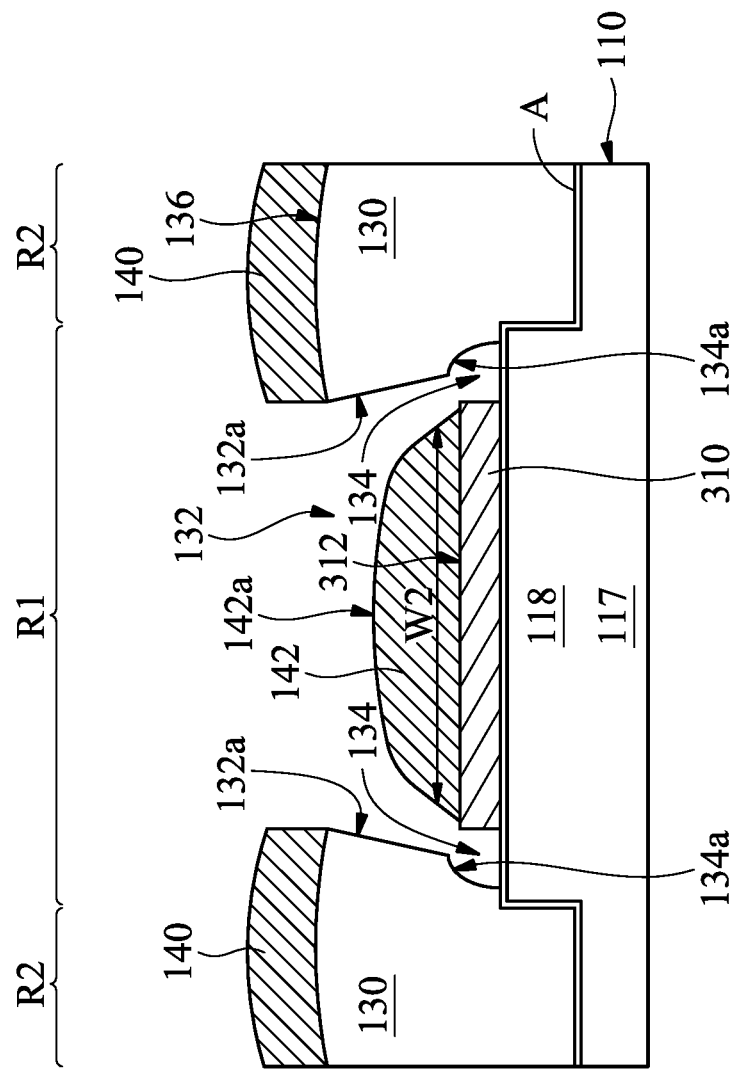

As shown in FIG. 4D, the conductive layer 140 over the inner wall 132a, the recess 134, and the insulating layer A is removed, in accordance with some embodiments. After the removal process, the conductive layer 140 remaining over the conductive structure 310 forms a conductive pad 142, in accordance with some embodiments.

The conductive pad 142 has a curved top surface 142a, in accordance with some embodiments. In some embodiments, a width W2 of the conductive pad 142 increases toward the substrate 110. The width W2 continuously increases toward the substrate 110, in accordance with some embodiments. The removal process includes an etching process, such as a wet etching process, in accordance with some embodiments.

Figure 4E:
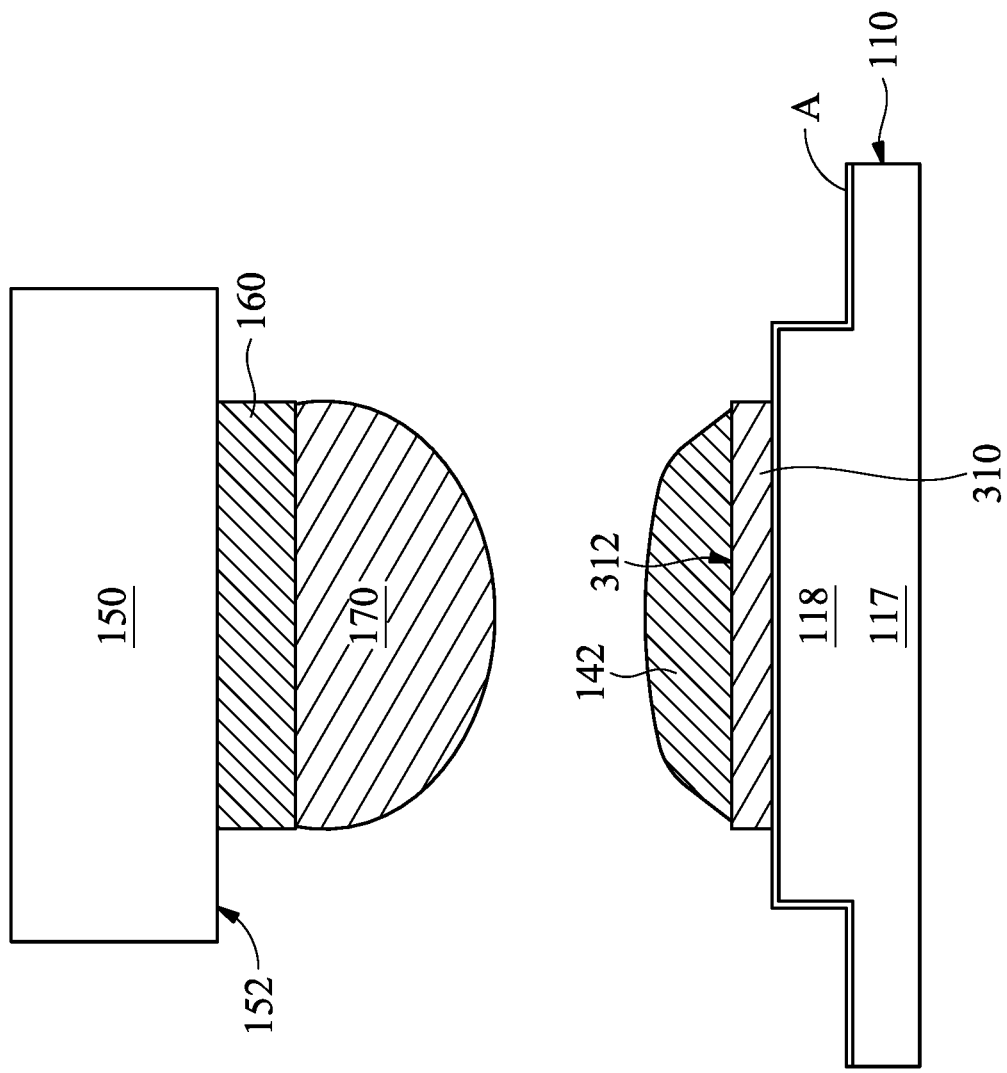

As shown in FIG. 4E, a device 150 is provided, in accordance with some embodiments. The device 150 includes a chip, a package, an active device, a passive device, a light emitting device, or another suitable device. The light emitting device includes laser diodes (not shown) for emitting laser beams, in accordance with some embodiments. The device 150 has a bottom surface 152, in accordance with some embodiments.

As shown in FIG. 4E, a conductive pad 160 is formed over the bottom surface 152 of the device 150, in accordance with some embodiments. The conductive pad 160 is electrically connected to the device 150, in accordance with some embodiments. As shown in FIG. 4E, a solder layer 170 is formed over the conductive pad 160, in accordance with some embodiments. The conductive pad 160 is between the device 150 and the solder layer 170, in accordance with some embodiments.

Figure 4F:
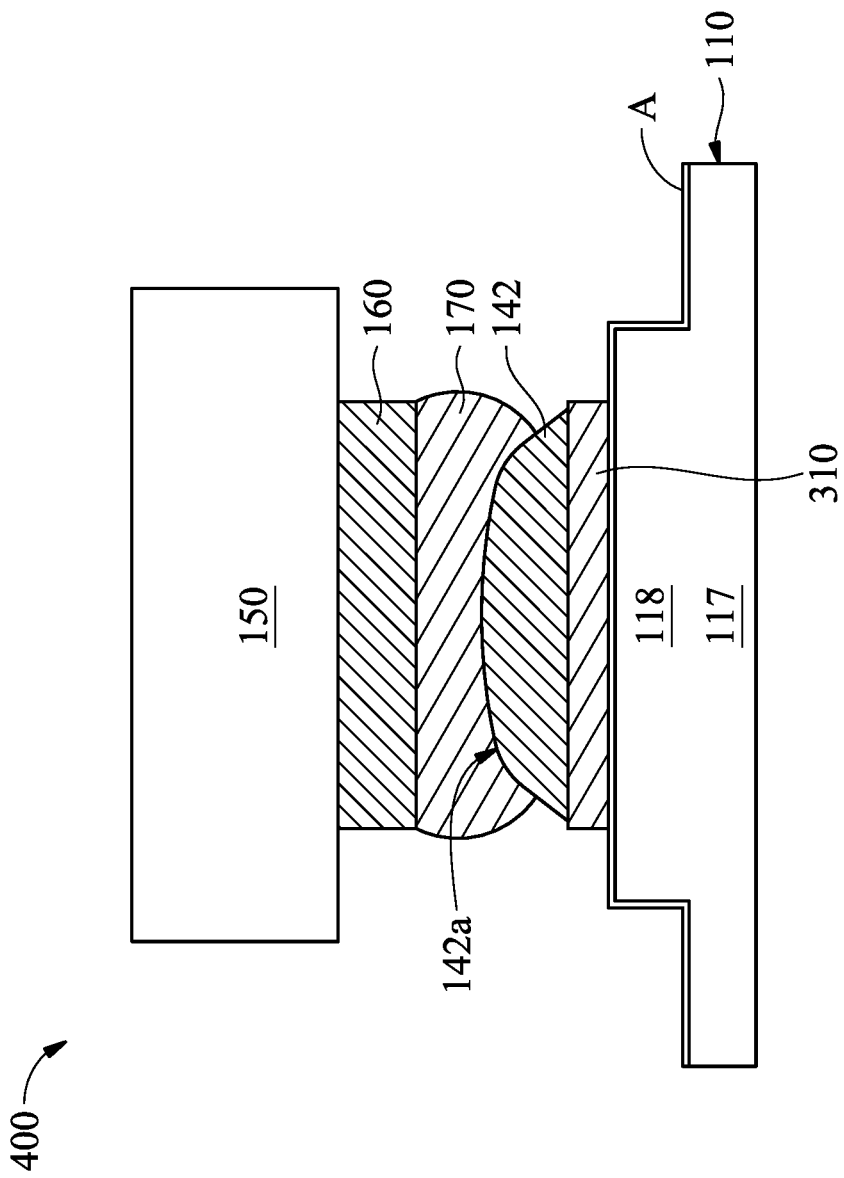

As shown in FIG. 4F, the device 150 is bonded to the conductive pad 142 through the conductive pad 160 and the solder layer 170, in accordance with some embodiments. The conductive pad 142 partially extends into the solder layer 170, in accordance with some embodiments. In this step, a semiconductor device 400 is formed, in accordance with some embodiments.

Many variations and/or modifications can be made to embodiments of the application. For example, the shape, profile, and/or distribution of the protrusion portion 114 of FIGS. 1A, 1A-1 and 1A-2 may be varied in different embodiments. FIGS. 5-14 are top views of different variations of the protrusion portion 114, in accordance with some embodiments.

Figure 5:
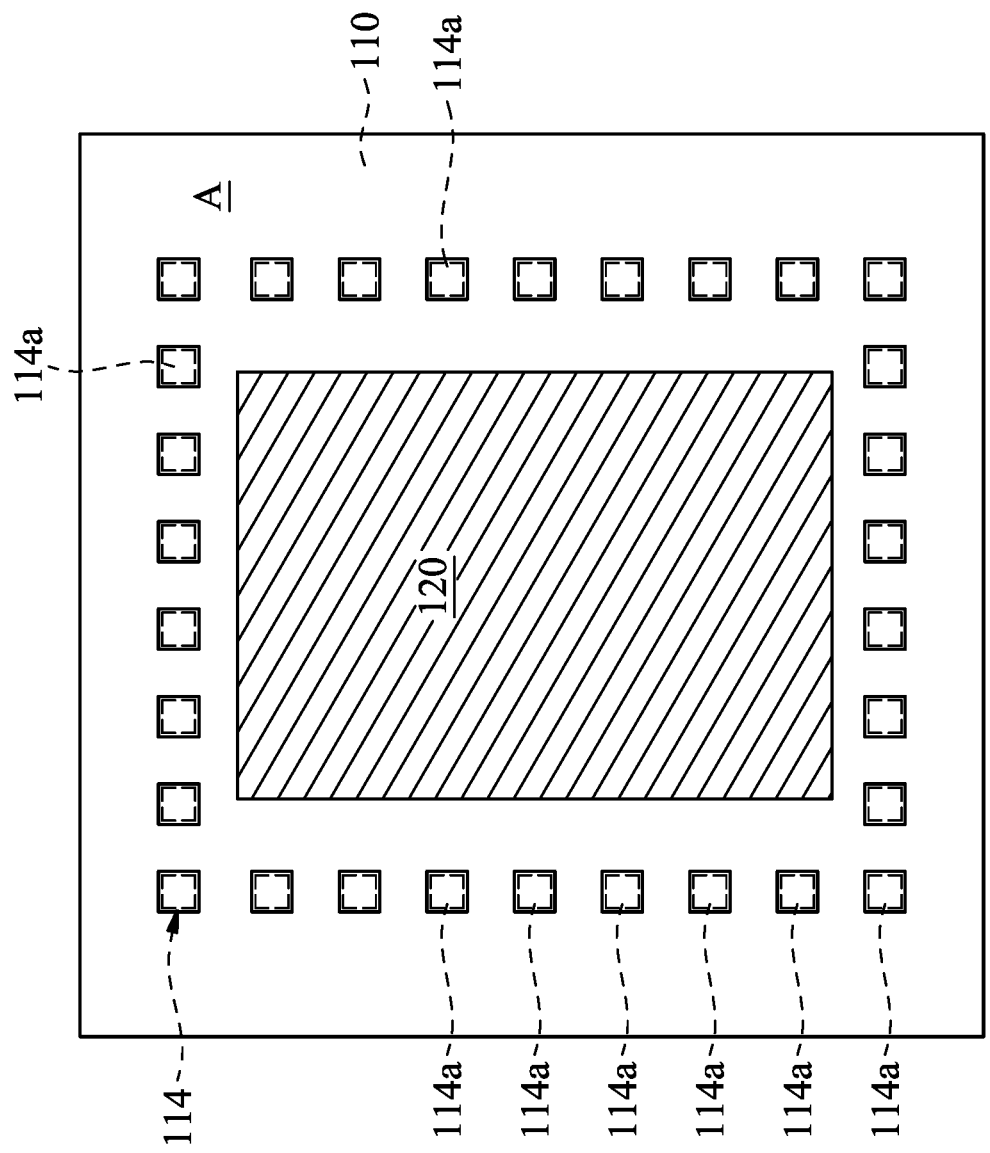
FIG. 5 is a top view of a variation of a protrusion portion of a substrate, an insulating layer, and a conductive wire, in accordance with some embodiments.

As shown in FIG. 5, the protrusion portion 114 of FIG. 5 is similar to the protrusion portion 114 of FIG. 1A-1, except that the protrusion portion 114 of FIG. 5 surrounds the entire conductive wire 120, in accordance with some embodiments. The protrusion portion 114 includes pillar structures 114a spaced apart from each other, in accordance with some embodiments.

Figure 6:
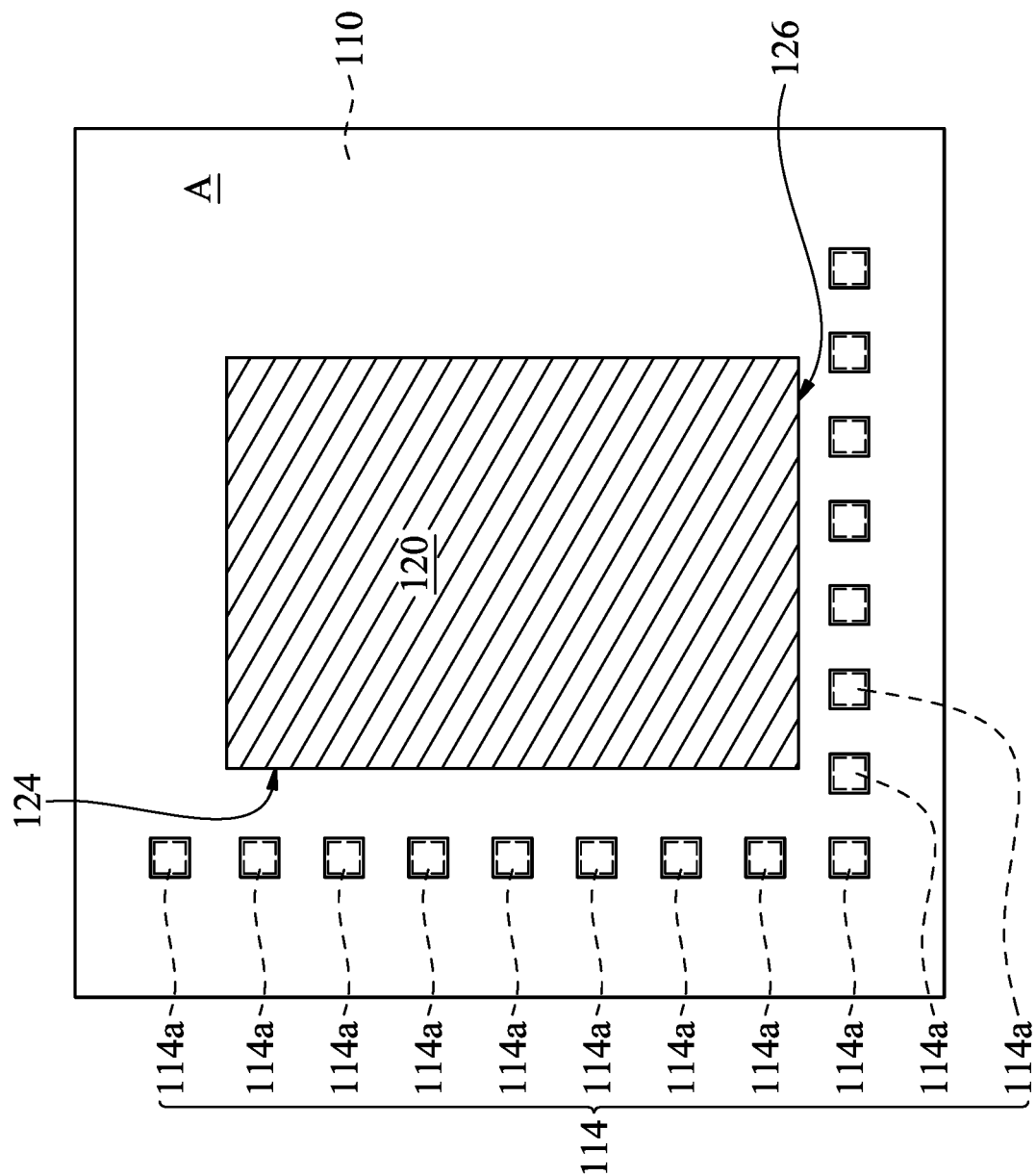
FIG. 6 is a top view of a variation of a protrusion portion of a substrate, an insulating layer, and a conductive wire, in accordance with some embodiments.

As shown in FIG. 6, the protrusion portion 114 of FIG. 6 is similar to the protrusion portion 114 of FIG. 1A-1, except that the protrusion portion 114 of FIG. 6 has an L-shape, in accordance with some embodiments. The protrusion portion 114 is adjacent to sidewalls 124 and 126 of the conductive wire 120, in accordance with some embodiments. The protrusion portion 114 includes pillar structures 114a spaced apart from each other, in accordance with some embodiments. The pillar structures 114a are arranged along the sidewalls 124 and 126, in accordance with some embodiments.

Figure 7:
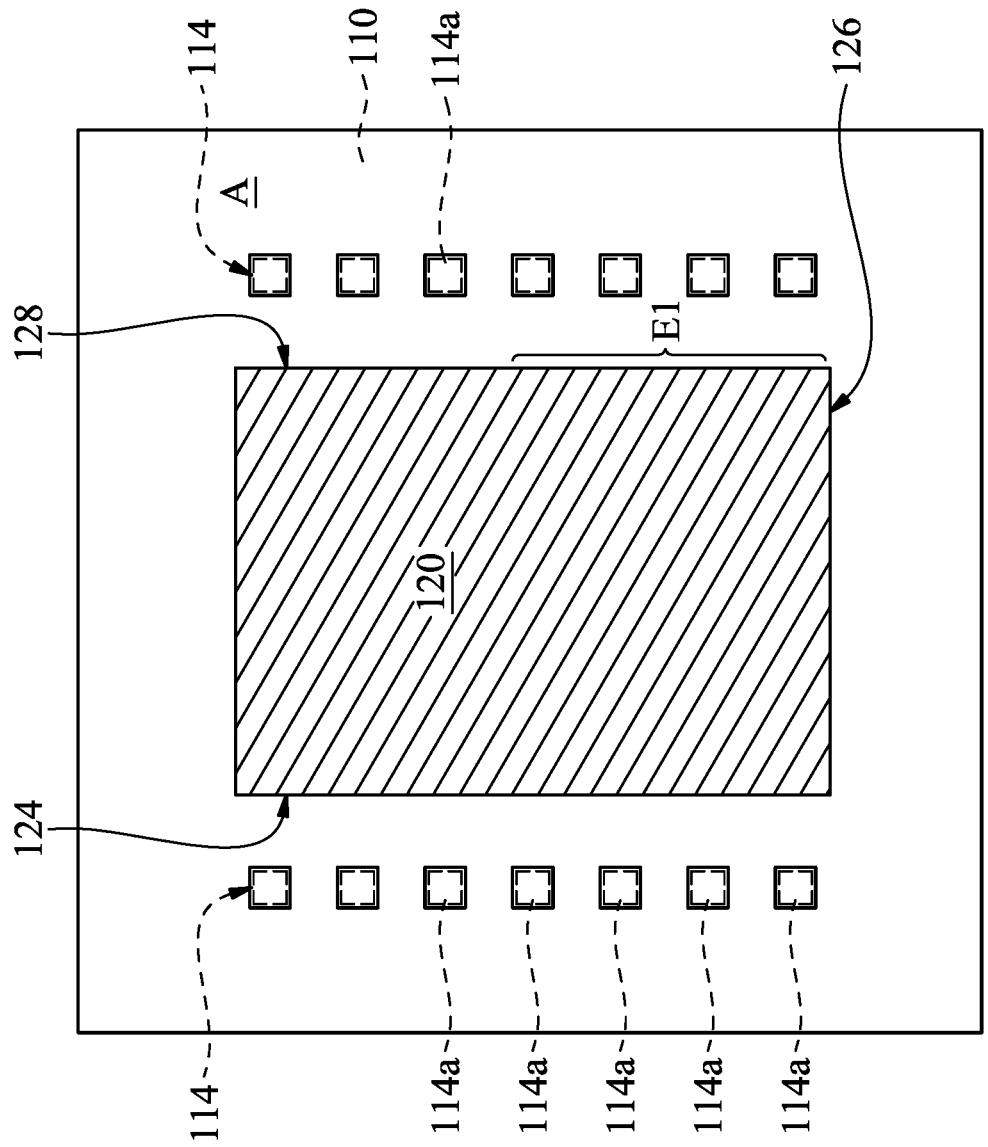
FIG. 7 is a top view of a variation of a protrusion portion of a substrate, an insulating layer, and a conductive wire, in accordance with some embodiments.

As shown in FIG. 7, the protrusion portion 114 of FIG. 7 is similar to the protrusion portion 114 of FIG. 1A-1, except that the protrusion portion 114 of FIG. 7 is adjacent to only two sidewalls 124 and 128 of the conductive wire 120, in accordance with some embodiments. The protrusion portion 114 includes pillar structures 114a spaced apart from each other, in accordance with some embodiments. The pillar structures 114a are arranged along the sidewalls 124 and 128, in accordance with some embodiments.

Figure 8:
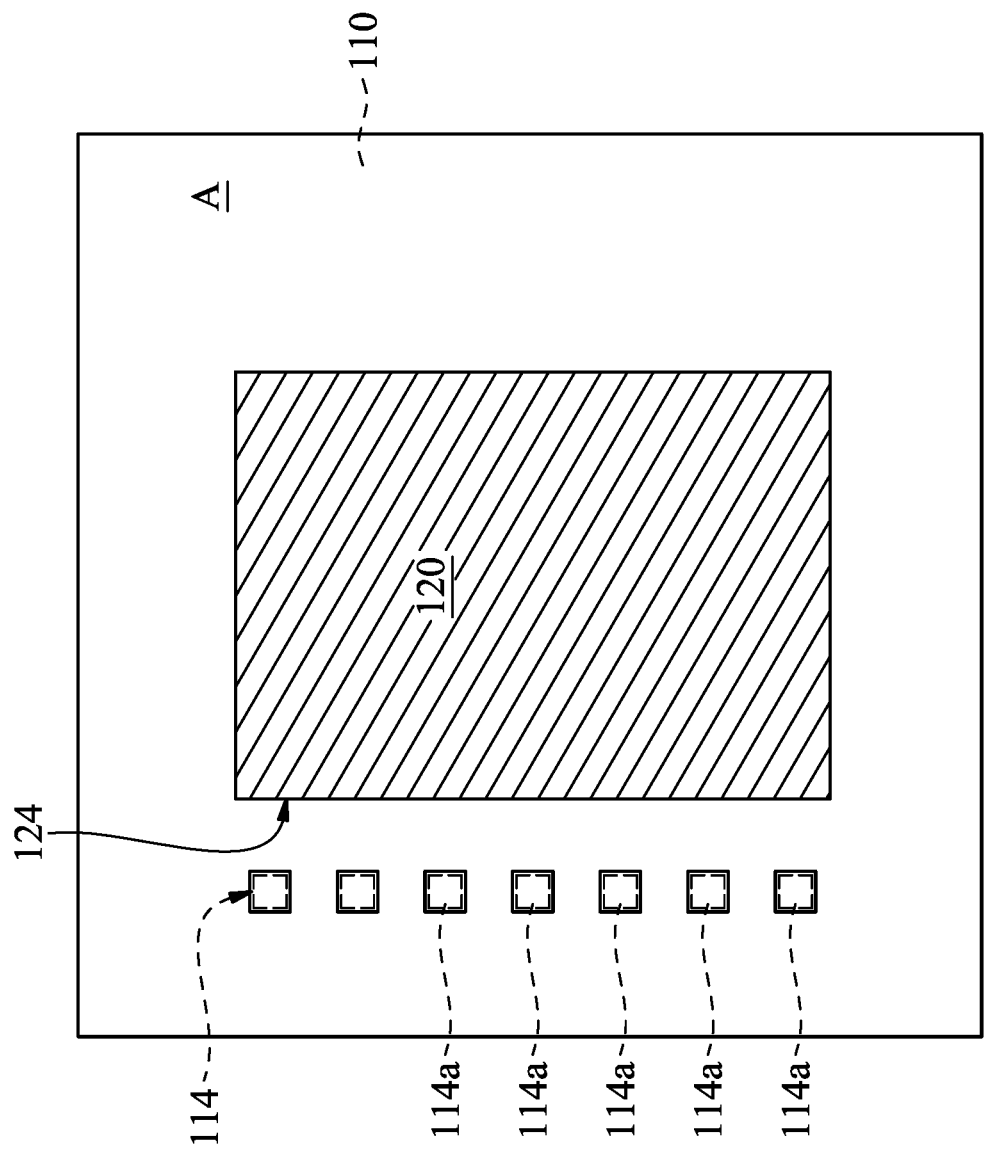
FIG. 8 is a top view of a variation of a protrusion portion of a substrate, an insulating layer, and a conductive wire, in accordance with some embodiments.

As shown in FIG. 8, the protrusion portion 114 of FIG. 8 is similar to the protrusion portion 114 of FIG. 1A-1, except that the protrusion portion 114 of FIG. 8 is adjacent to only one sidewall 124 of the conductive wire 120, in accordance with some embodiments. The protrusion portion 114 includes pillar structures 114a spaced apart from each other, in accordance with some embodiments. The pillar structures 114a are arranged along the sidewall 124, in accordance with some embodiments.

Figure 9:
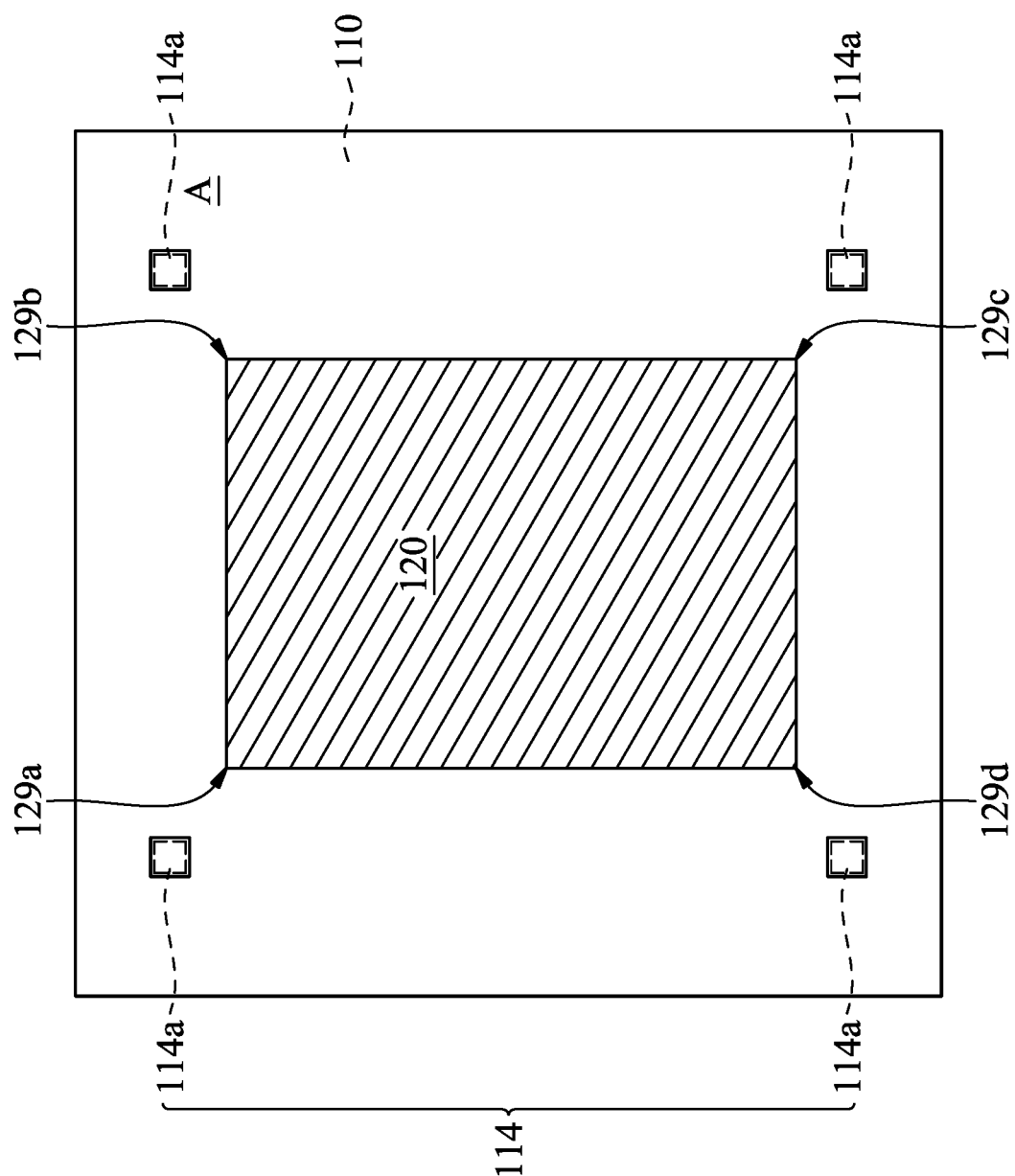
FIG. 9 is a top view of a variation of a protrusion portion of a substrate, an insulating layer, and a conductive wire, in accordance with some embodiments.

As shown in FIG. 9, the protrusion portion 114 of FIG. 9 is similar to the protrusion portion 114 of FIG. 1A-1, except that the protrusion portion 114 of FIG. 9 is adjacent to corners 129a, 129b, 129c and 129d of the conductive wire 120, in accordance with some embodiments. The protrusion portion 114 includes pillar structures 114a spaced apart from each other, in accordance with some embodiments.

Figure 10:
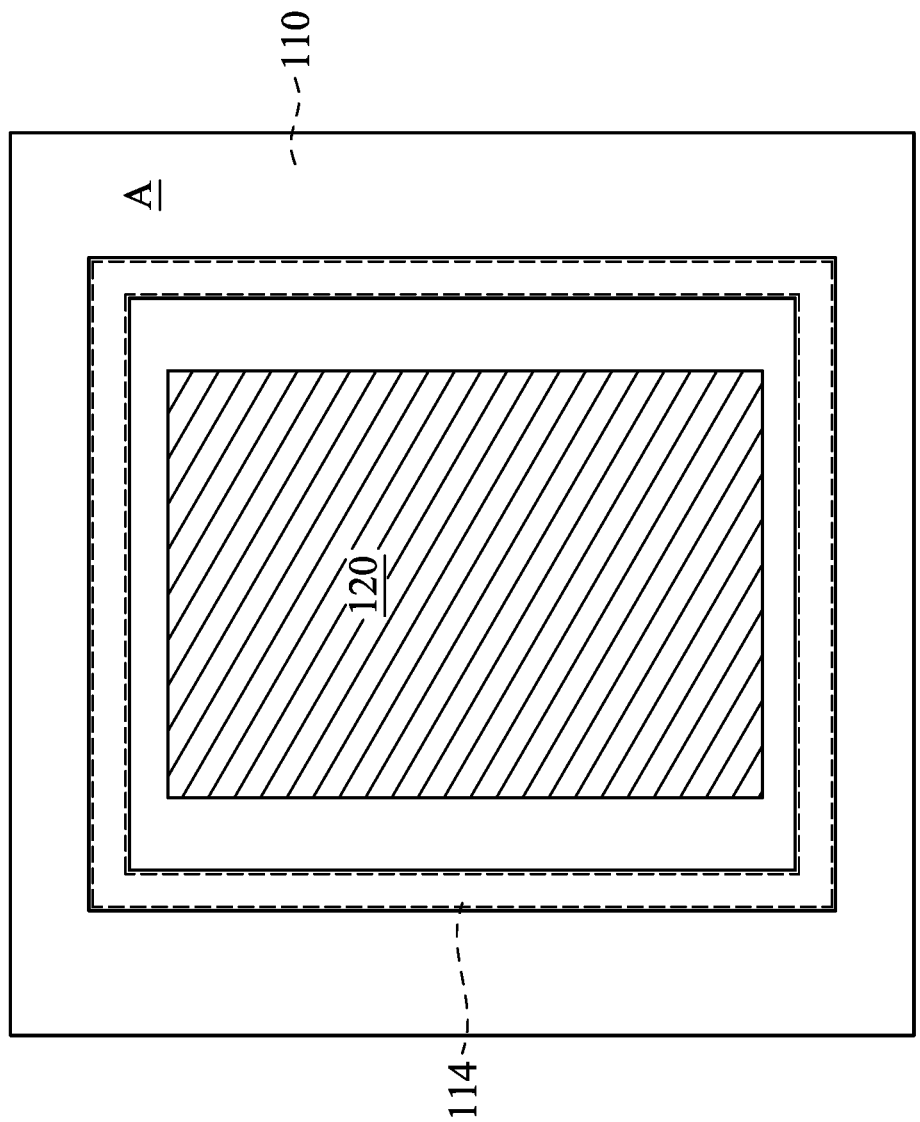
FIG. 10 is a top view of a variation of a protrusion portion of a substrate, an insulating layer, and a conductive wire, in accordance with some embodiments.

As shown in FIG. 10, the protrusion portion 114 of FIG. 10 is similar to the protrusion portion 114 of FIG. 1A-2, except that the protrusion portion 114 of FIG. 10 continuously surrounds the entire conductive wire 120, in accordance with some embodiments.

Figure 11:
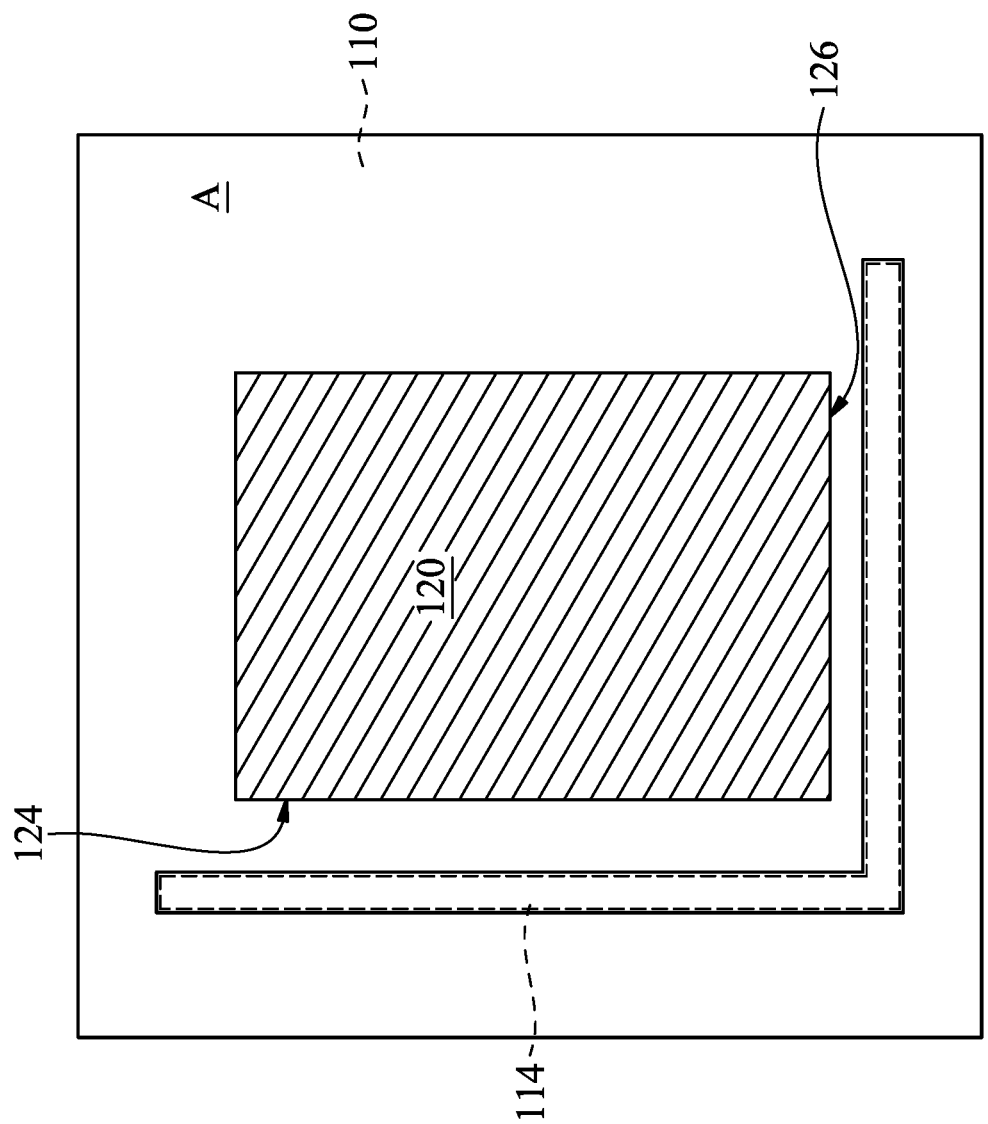
FIG. 11 is a top view of a variation of a protrusion portion of a substrate, an insulating layer, and a conductive wire, in accordance with some embodiments.

As shown in FIG. 11, the protrusion portion 114 of FIG. 11 is similar to the protrusion portion 114 of FIG. 1A-2, except that the protrusion portion 114 of FIG. 11 has an L-shape, in accordance with some embodiments. The protrusion portion 114 is adjacent to sidewalls 124 and 126 of the conductive wire 120, in accordance with some embodiments.

Figure 12:
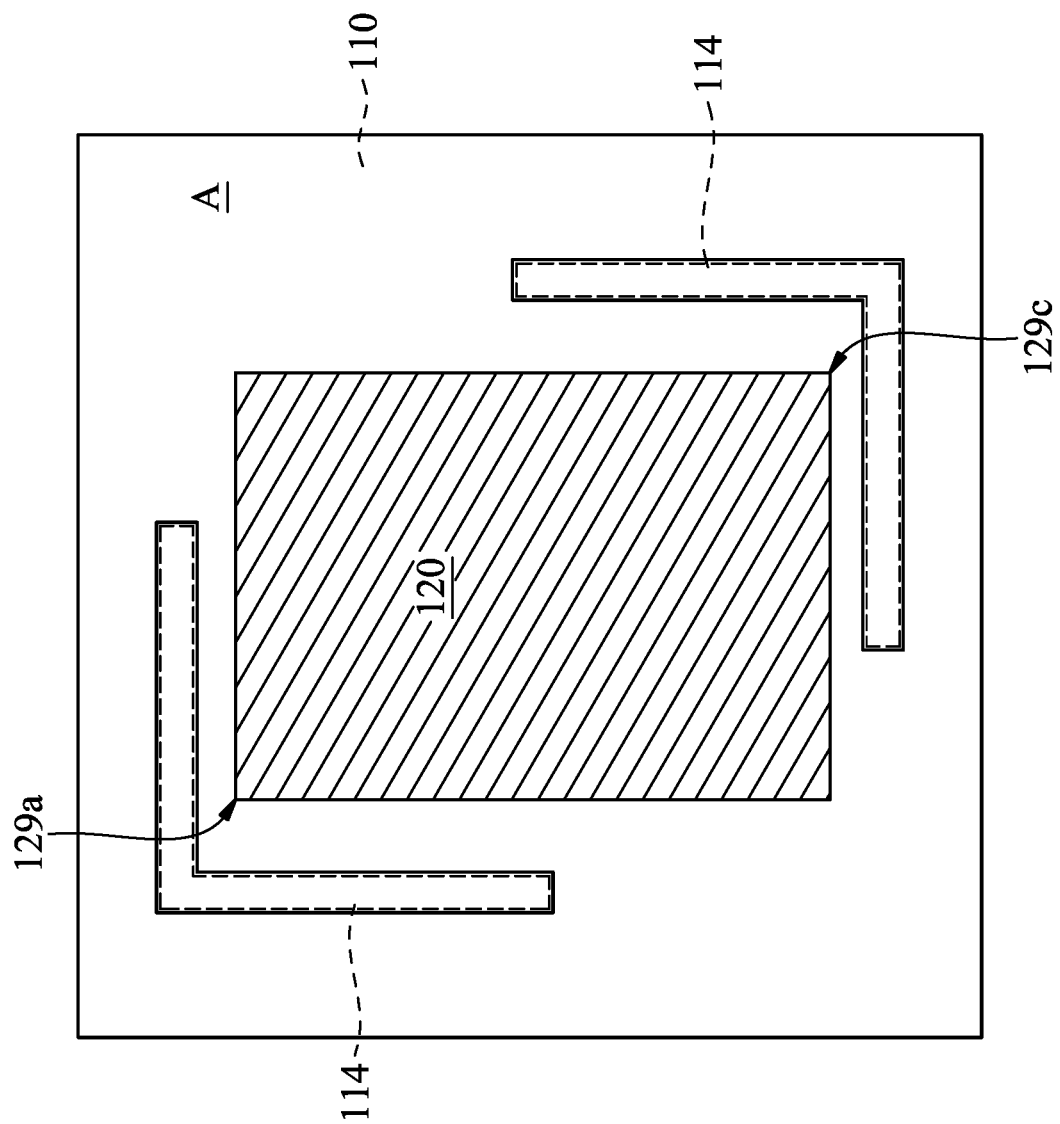
FIG. 12 is a top view of a variation of a protrusion portion of a substrate, an insulating layer, and a conductive wire, in accordance with some embodiments.

As shown in FIG. 12, the protrusion portion 114 of FIG. 12 is similar to the protrusion portion 114 of FIG. 1A-2, except that the protrusion portion 114 of FIG. 12 is adjacent to corners 129a and 129c of the conductive wire 120, in accordance with some embodiments. The protrusion portion 114 of FIG. 12 surrounds the corners 129a and 129c, in accordance with some embodiments.

Figure 13:
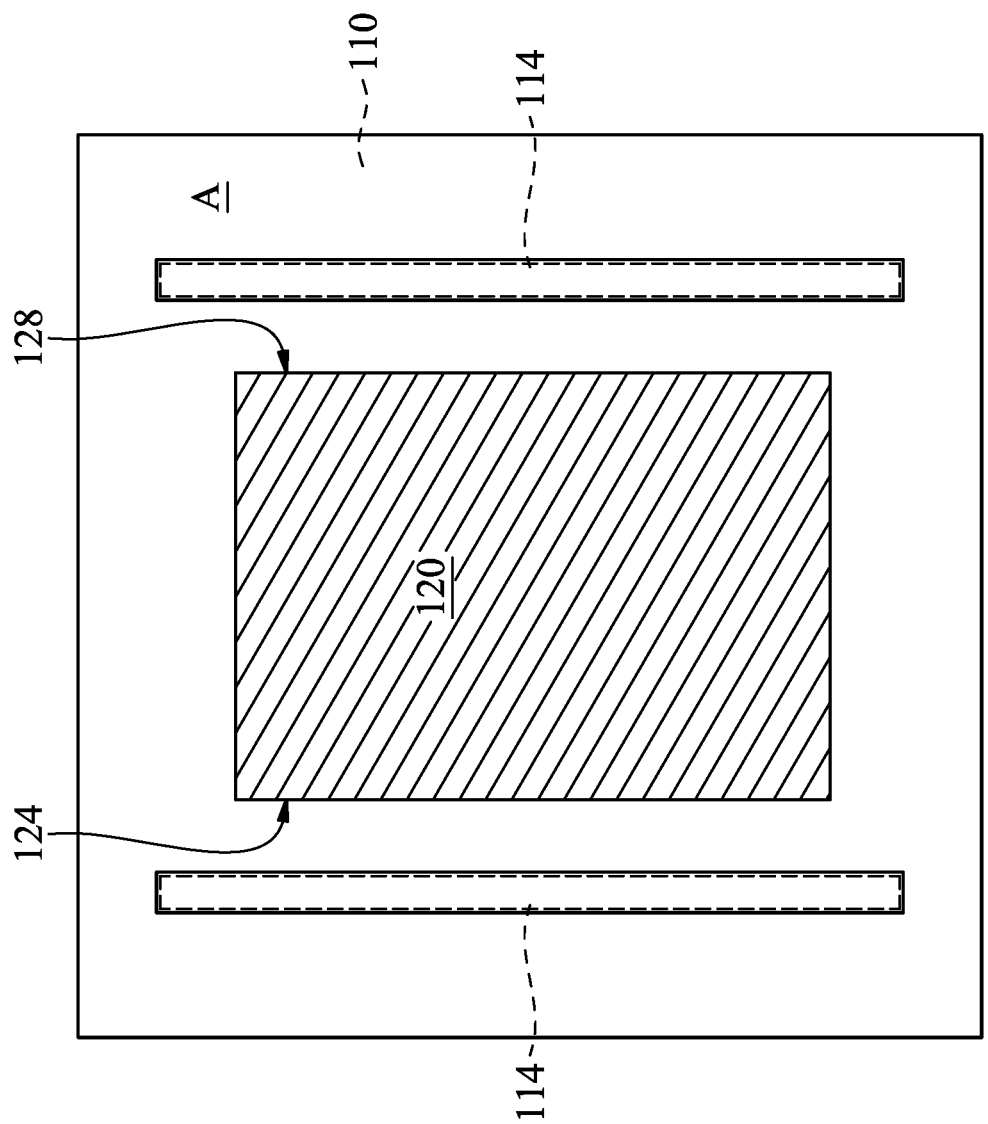
FIG. 13 is a top view of a variation of a protrusion portion of a substrate, an insulating layer, and a conductive wire, in accordance with some embodiments.

As shown in FIG. 13, the protrusion portion 114 of FIG. 13 is similar to the protrusion portion 114 of FIG. 1A-2, except that the protrusion portion 114 of FIG. 13 is adjacent to only two sidewalls 124 and 128 of the conductive wire 120, in accordance with some embodiments.

Figure 14:
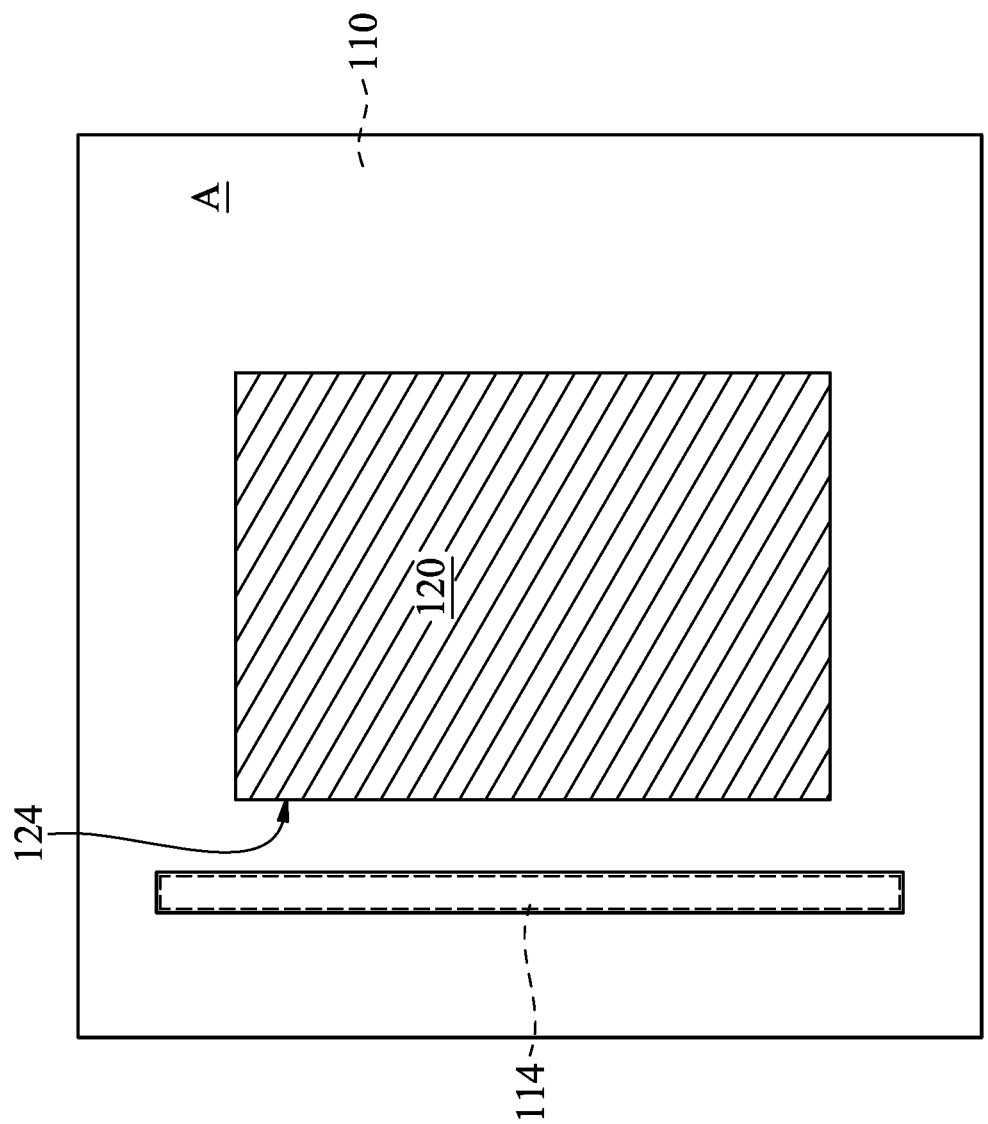
FIG. 14 is a top view of a variation of a protrusion portion of a substrate, an insulating layer, and a conductive wire, in accordance with some embodiments.

As shown in FIG. 14, the protrusion portion 114 of FIG. 14 is similar to the protrusion portion 114 of FIG. 1A-2, except that the protrusion portion 114 of FIG. 14 is adjacent to only one sidewall 124 of the conductive wire 120, in accordance with some embodiments.

It should be noted that the elements in FIGS. 2-14, which are named or labeled identically to those in FIGS. 1A-1G, have materials, structures (including relative sizes, angles, shapes, thicknesses, widths, or the like), and forming methods that are similar thereto or the same thereas. Therefore, detailed descriptions are not repeated herein.

In accordance with some embodiments, semiconductor devices and methods for forming the same are provided. The methods (for forming the semiconductor device) form a conductive pad surrounded by a protrusion portion by using a lift-off process to prevent the formation of the conductive pad from being affected by the protrusion portion.

In accordance with some embodiments, a semiconductor device is provided. The semiconductor device includes a substrate having a surface. The semiconductor device includes a conductive pad over a portion of the surface. The conductive pad has a curved top surface, and a width of the conductive pad increases toward the substrate. The semiconductor device includes a device over the conductive pad. The semiconductor device includes a solder layer between the device and the conductive pad. The solder layer covers the curved top surface of the conductive pad, and the conductive pad extends into the solder layer.

In accordance with some embodiments, a semiconductor device is provided. The semiconductor device includes a conductive wire over a substrate and having sidewalls. The semiconductor device includes a conductive pad partially covering the conductive wire. A thickness of the conductive pad decreases toward the sidewalls of the conductive wire. The semiconductor device includes a device bonded to the conductive pad through a solder layer.

In accordance with some embodiments, a semiconductor device is provided. The semiconductor device includes a conductive wire over a substrate. The semiconductor device includes a conductive pad over the conductive wire. The conductive pad has a convex surface. The semiconductor device includes a solder layer covering an upper portion of the conductive pad and exposing a lower portion of the conductive pad. The upper portion is narrower than the lower portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a surface;
   a conductive pad over a portion of the surface, wherein the conductive pad has a curved top surface, a width of the conductive pad increases toward the substrate, the substrate has a first portion and a second portion adjacent to the first portion, the first portion and the second portion have different thicknesses, and the conductive pad is over the first portion;
   a device over the conductive pad; and
   a solder layer between the device and the conductive pad, wherein the solder layer covers the curved top surface of the conductive pad, and the conductive pad extends into the solder layer.

2. The semiconductor device as claimed in claim 1, wherein the second portion is thicker than the first portion.

3. The semiconductor device as claimed in claim 1, wherein the first portion is thicker than the second portion.

4. The semiconductor device as claimed in claim 1, wherein a central portion of the conductive pad is thicker than an outer portion of the conductive pad.

5. The semiconductor device as claimed in claim 1, further comprising:
   a conductive wire extending over the substrate, wherein the conductive pad is on and in direct contact with the conductive wire.

6. The semiconductor device as claimed in claim 1, wherein the device comprises a protrusion portion bonded to the substrate.

7. The semiconductor device as claimed in claim 6, wherein the device comprises a second conductive pad, and the protrusion portion laterally surrounds the second conductive pad, the solder layer, and an upper portion of the conductive pad.

8. The semiconductor device as claimed in claim 1, wherein the device comprises a plurality of protrusion portions laterally surrounding the solder layer and an upper portion of the conductive pad.

9. The semiconductor device as claimed in claim 1, wherein the conductive pad comprises gold, copper, silver, or a combination thereof.

10. A semiconductor device, comprising:
    a conductive wire over a substrate and having sidewalls;
    a conductive pad partially covering the conductive wire, wherein a thickness of the conductive pad decreases toward the sidewalls of the conductive wire; and
    a device bonded to the conductive pad through a solder layer, wherein an interface between the conductive pad and the solder layer is a convex curved surface.

11. The semiconductor device as claimed in claim 10, further comprising:
    a protruding structure over the substrate, wherein the protruding structure partially surrounds the conductive pad and the conductive wire.

12. The semiconductor device as claimed in claim 10, further comprising:
    a plurality of pillar structures over the substrate, wherein the pillar structures partially surround the conductive pad and the conductive wire.

13. The semiconductor device as claimed in claim 12, further comprising:
    an insulating layer extending along sidewalls and top surfaces of the pillar structures.

14. The semiconductor device as claimed in claim 10, wherein a peripheral portion of the conductive pad is exposed by the solder layer.

15. The semiconductor device as claimed in claim 10, wherein the solder layer is wrapped around an upper portion of the conductive pad.

16. The semiconductor device as claimed in claim 10, wherein the solder layer has a central portion and a peripheral portion surrounding the central portion, and the central portion is thinner than the peripheral portion.

17. A semiconductor device, comprising:
    a conductive wire over a substrate;
    a conductive pad over the conductive wire, wherein the conductive pad has a convex surface;
    a solder layer covering an upper portion of the conductive pad and exposing a lower portion of the conductive pad, wherein the upper portion is narrower than the lower portion; and
    a plurality of protruding pillars over the substrate, wherein the protruding pillars are positioned beside the conductive pad and the conductive wire.

18. The semiconductor device as claimed in claim 17, wherein the conductive pad has a substantially planar bottom surface.

19. The semiconductor device as claimed in claim 17, further comprising:
    a device bonded to the conductive pad through the solder layer.

20. The semiconductor device as claimed in claim 19, wherein the device has a protrusion portion bonded to the protruding pillars.

* * * * *